US006578170B1

(12) United States Patent
Piret et al.

(10) Patent No.: US 6,578,170 B1
(45) Date of Patent: Jun. 10, 2003

(54) CODING DEVICE AND METHOD, DECODING DEVICE AND METHOD AND SYSTEMS USING THEM

(75) Inventors: Philippe Piret, Cesson-Sevigne (FR); Claude Le Dantec, Saint Hilaire des Landes (FR)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/470,205

(22) Filed: Dec. 22, 1999

(30) Foreign Application Priority Data

Dec. 30, 1998 (FR) ............................................. 98 16668

(51) Int. Cl.[7] ........................ H03M 13/29; H03M 13/27
(52) U.S. Cl. ...................... 714/758; 714/755; 714/787
(58) Field of Search .............................. 714/755, 780, 714/787, 758

(56) References Cited

U.S. PATENT DOCUMENTS

| 5,381,423 | A | | 1/1995 | Turco ........................ 371/39.1 |
| 5,734,962 | A | * | 3/1998 | Hladik et al. ................ 370/342 |
| 5,761,248 | A | * | 6/1998 | Hagenauer et al. ......... 375/340 |
| 6,161,209 | A | * | 12/2000 | Moher ........................ 375/262 |
| 6,182,261 | B1 | * | 1/2001 | Haller et al. ................ 714/758 |
| 6,192,503 | B1 | * | 2/2001 | Chennakeshu et al. ..... 714/755 |
| 6,233,709 | B1 | * | 5/2001 | Zhang et al. ............... 714/774 |
| 6,272,183 | B1 | * | 8/2001 | Berens et al. ............... 375/262 |
| 6,292,918 | B1 | * | 9/2001 | Sindhushayana et al. ... 714/755 |
| 6,370,670 | B1 | * | 4/2002 | Le Dantec et al. ......... 714/701 |

FOREIGN PATENT DOCUMENTS

| EP | 0571019 | 11/1993 |
| EP | 0928071 | 7/1999 |
| WO | WO9624098 | 8/1996 |

OTHER PUBLICATIONS

Anderson, "Turbo Coding for Deep Space Applications", 1995 IEEE International Symposium on Information Theory, p. 36.*
Berrou et al., "Frame–Oriented Convolutional Turbo Codes", Electronics Letters, Jul. 18, 1996, pp. 1362–1364.*
Perez et al., "A Distance Spectrum Interpretation of Turbo Codes", IEEE Transactions on Information Theory, vol. 42, No. 6, Nov. 1996, pp. 1698–1709.*
Narayanan et al., "Selective Serial Concatenation of Turbo Codes", IEEE Communications Letters, vol. 1, No. 5, Sep. 1997, pp. 136–139.*

(List continued on next page.)

*Primary Examiner*—Stephen M. Baker
(74) *Attorney, Agent, or Firm*—Fitzpatrick, Cella, Harper & Scinto

(57) ABSTRACT

The decoding method to which the present invention relates takes into account:
    at least one predetermined polynomial, and
    a received sequence r capable of being the result of the coding of a sequence of information symbols of polynomial representation u(x) representing a physical quantity, the coding including a turbocoding, and guaranteeing the divisibility of a sequence to be turbocoded, a(x) representing the sequence u(x), by each predetermined polynomial, This method includes:
    an operation of turbodecoding (601) the received sequence r into an estimated sequence â,
    at least one operation of calculating the remainder (602, 606) of the division of the polynomial representation â(x) of the estimated sequence â, by a said predetermined polynomial.

57 Claims, 9 Drawing Sheets

OTHER PUBLICATIONS

McEliece et al., "Permutations Preserving Divisibility", IEEE Transactions on Information Theory, vol. 47, No. 3, Mar. 2001, pp. 1206–1207.*

Berrou et al., Les Turbo–Codes: Une Nouvelles Approche Du Codage, Ree: Revue General De L'Electricite Et De L'Electronique, No. 1, 1997, pp. 68–74.

Berrou et al., Near Optimum Error Correcting Coding and Decoding: Turbo–Codes, IEEE Transactions on Comm., vol. 44, No. 10, 1996, pp. 1261–1271.

Koora et al., Interleaver Design For Turbo Codes With Selected Inputs, Electronics Letters, vol. 34, No. 7, 1998, pp. 651–652.

* cited by examiner

CODING DEVICE AND METHOD, DECODING DEVICE AND METHOD AND SYSTEMS USING THEM

The present invention concerns a coding device, a coding method, a decoding device and method and systems using them.

It applies equally well to the coding of data representing a physical quantity, to the coding of data in the form of codes capable of modulating a physical quantity, to the decoding of data-modulated signals, and to the decoding of data representing physical quantities. These data can, for example, represent images, sounds, computer data, electrical quantities or stored data.

The invention finds an application in the field of convolutional codes. When the latter are used to implement an iterative decoding, these codes are greatly improved when their coders contain a permutation device. In this case, they are usually referred to as "turbocodes" and the corresponding iterative decoder is referred to as a "turbodecoder". For convenience:
- the operation performed by the turbocoder is referred to as "turbocoding" and this operation provides a so-called "turbocoded" sequence, and
- the operation performed by the decoder is referred to as "turbodecoding" and this operation provides a so-called "turbodecoded" sequence.

On these subjects, documents which serve as a reference are, on the one hand, the article by Messrs. C. BERROU, A. GLAVIEUX and P. THITIMAJSHIMA entitled *"Near Shannon limit error-correcting coding and decoding: turbocodes"* published with the reports of the "ICC'93" conference, 1993, pages 1064 to 1070, and on the other hand, the article by Messrs. C. BERROU and A. GLAVIEUX entitled *"Near Optimum error-correcting coding and decoding: turbo-codes"* published by IEEE Transactions on Communication, Volume COM-44, pages 1261 to 1271, in October 1996.

However, the formation of permutation devices is far from being completely mastered. Certain of these devices use square or rectangular matrices which are written into one row after another and read from one column after another. These matrices are generally very large, for example 256× 256 in size.

A parallel turbocoder of efficiency equal to ⅓ can be considered as a pair of convolutional systematic recursive coders with divisor polynomials such that the first coder produces a check sequence from the sequence of symbols to be coded u and the second coder produces a check sequence from an interleaved sequence u* obtained by interleaving (or "permutation") of the sequence u. In this context, the simultaneous return to zero of the two coders is a classic problem. One way of solving it has been found by the inventors and is summarized below.

With the aim of clarity, it will be assumed, subsequently, that the two divisor polynomials of the turbocoder are equal and referred to as $g(x)$. Let m be the degree of the polynomial $g(x)$ and let $N0$ be the smallest integer such that $g(x)$ is a divisor of the polynomial $x^{N0}+1$. For reasons described below, a polynomial $g(x)$ is chosen having no divisor which is the square of a polynomial of degree equal to or greater than 1, and this leads to $N0$ being an odd number.

Also let n be an odd multiple of $N0$: $n=M\ N0$.

A sequence of symbols, u, then has a polynomial representation $u(x)$, of degree $n-m-1$, with binary coefficients, and this polynomial $u(x)$ is precoded into:

$$a(x)=u(x)+\Sigma_{i=n-m\ to\ n-1}a_i x^i$$

where the m binary symbols $a_i$ are chosen in such a way that $a(x)$ is a multiple of $g(x)$. As a consequence of this preceding and the chosen values of the parameters, if $a(x)$ is a multiple of $g(x)$, then $a^*(x)=a(x^e)$ modulo $x^n+1$ is also a multiple of $g(x)$ for any value of e which is a power of 2.

In the remainder of the description, the permutation and interleaver type described above is referred to as "x to $x^e$".

Here, it is necessary to consider that $g(x)$ has no multiple factor since, in general, $a^*(x)$ is guaranteed to be divisible only by the irreducible factors of $g(x)$.

The coded version of u is then given by $v=[a, ah_1/g, a^*h_2/g]$, where all the components are polynomials, and where, in particular, $a^*h_2/g$ is also a polynomial, by virtue of the definition of $a^*$ and the choice of e as a power of 2.

With general turbocodes, the decoding is essentially an iterative procedure (on this subject see the document by Messrs. BERROU and GLAVIEUX, *"Near optimum error-correcting and decoding: turbocodes"*, IEEE Trans. On Comm., Vol. COM-44, pages 1261 to 1271, October 1996).

The document by J. ANDERSEN is known, *"Turbocoding for deep space applications"*, proceedings IEEE 1995, International Symposium on Information Theory, Whistler, Canada, September 1995, in which a BCH code is used for correcting the residual errors. However, this solution has a fairly limited effectiveness in terms of residual error bit correction. The inventors observed that this last remark was particularly true in the case of the use of "x to $x^e$" type interleavers.

The present invention aims to remedy these drawbacks. To this end, the present invention relates, according to a first aspect, to a method of coding a sequence of information symbols of polynomial representation $u(x)$, including:
- a turbocoding operation, and
- an operation of transmitting, on a transmission channel, the sequence resulting from the turbocoding operation, characterised in that it also includes, as a preliminary to the said turbocoding operation, at least one precoding operation during which there are added, to the said sequence $u(x)$, redundant symbols which guarantee the divisibility of the precoded sequence by at least one predetermined polynomial which is:
- a non-trivial multiple of the divisor polynomial used by the coder of the said turbocoder, a coder which acts on the precoded sequence, and
- which is among the polynomials which have a high probability of dividing the polynomial representing a transmission error on the said channel.

The present invention relates, according to a second aspect, to a decoding method, characterised in that it takes into account:
- at least one predetermined polynomial, and
- a received sequence r capable of being the result of the coding of a sequence of information symbols of polynomial representation $u(x)$ representing a physical quantity, the coding including a turbocoding, and guaranteeing the divisibility of a sequence to be turbocoded, $a(x)$ representing the sequence $u(x)$, by each predetermined polynomial, and in that it includes:
- an operation of turbodecoding the received sequence r into an estimated sequence â,
- at least one operation of calculating the remainder of the division of the polynomial representation $â(x)$ of the estimated sequence â, by a said predetermined polynomial.

The inventors, in fact, observed that the residual errors have, in the case described above ("x to $x^e$"), a particular structure as far as the iterations of the decoder are continued until their result stabilizes. This particular structure makes them, generally, divisible by one or more predetermined polynomials.

The present invention aims to make use of this observation by proposing a method for detection or correction of these residual errors which is well adapted to the coding scheme described above.

By virtue of the provisions of the present invention, the processing (detection or correction) of residual errors, after turbodecoding, can be performed, on the one hand, on the received sequence and, on the other hand, on the sequence resulting from the division operation. The implementation of the method of the present invention is therefore particularly simple.

For example, the information sequence $u(x)$ is precoded into a polynomial $a(x)=u(x)+\Sigma_{i=n-m \text{ to } n-1} a_i x^i$, so that the sequence $a(x)$ is a multiple, not only of the divisor polynomial of the turbocode, but also of other predetermined polynomials and of a generator polynomial denoted by $q(x)$ of a binary BCH code, or more generally of a binary cyclic code, in length at least equal to n, and correcting s errors, where s is for example chosen equal to four.

This particular precoding necessitates a value of m higher than the degree of $g(x)$. Consequently, at fixed n, the degree $n-m-1$ of the polynomials $u(x)$ representing the information is reduced in an adapted manner. By virtue of these provisions, processing for detection or correction of residual errors after turbodecoding can be performed, not only on the turbodecoded sequence, denoted by â, but also on the sequence or sequences obtained by dividing â by each of the said predetermined polynomials, each time this division is possible with no remainder.

After having been decoded into a word of the BCH code under consideration, each of the said sequences is multiplied by the predetermined polynomial corresponding to it.

Thus, the sequences resulting from the multiplication operation can be compared in order to determine the final estimate of the information sequence transmitted.

The advantage of this method is that, if the predetermined polynomials are well chosen, the residual error after turbodecoding is often divisible by one or more of these predetermined polynomials, and that, for at least one of these predetermined polynomials, the weight of the error after division is smaller than it was before division.

Thus, the residual errors after turbodecoding can be corrected although initially their weight is too high to allow correction by the BCH code or, more generally, by the cyclic code.

It should be noted here that the decoding method in accordance with the present invention can operate in relation with coding methods of the prior art, and, in particular, with those which use so-called "padding" operations which guarantee the divisibility of a sequence to be turbocoded by a divisor polynomial of the said turbocoder.

According to particular characteristics, during an operation of calculating the remainder of the division of the polynomial representation of the estimated sequence â, the predetermined polynomial is a divisor polynomial of a coder of the said turbocoder, a coder which acts on the sequence $a(x)$.

By virtue of these provisions, the effect of the invention is obtained, at least partially, without supplementary addition of redundancy to the information sequence to be transmitted.

According to other particular characteristics, the decoding method as briefly described above includes an error detection operation during which:

it is determined whether or not the remainder from the said division remainder calculation operation is null, and, where this remainder is not null, an error is detected.

By virtue of these provisions, the error detection is particularly easy.

The present invention relates, according to a third aspect, to a decoding device, characterised in that it has a processing means adapted:

A/ to take into account:
   at least one predetermined polynomial, and
   a received sequence r capable of being the result of the coding of a sequence of information symbols of polynomial representation $u(x)$ representing a physical quantity, the coding including a turbocoding, and guaranteeing the divisibility of a sequence to be turbocoded, $a(x)$ representing the sequence $u(x)$, by each predetermined polynomial, and B/ to turbodecode the received sequence r into an estimated sequence â, and C/ to calculate the remainder of the division of the polynomial representation $â(x)$ of the estimated sequence â, by each said predetermined polynomial.

The present invention relates, according to a fourth aspect, to a device for coding a sequence of information symbols of polynomial representation $u(x)$, having:

a processing means adapted to turbocode, and a means of transmitting, on a transmission channel, the sequence resulting from the turbocoding, characterised in that the processing means is adapted, as a preliminary to the turbocoding, to precode the said sequence $u(x)$, adding redundant symbols thereto which guarantee the divisibility of the precoded sequence by at least one predetermined polynomial which is:

a non-trivial multiple of the divisor polynomial used by the coder of the said turbocoder, a coder which acts on the precoded sequence, and which is among the polynomials which have a high probability of dividing the polynomial representing a transmission error on the said channel.

The invention also relates to:

an information storage means readable by a computer or a microprocessor storing instructions of a computer program, characterised in that it allows the implementation of the method of the invention as briefly described above, and an information storage means which is removable, partially or totally, and readable by a computer or a microprocessor storing instructions of a computer program, characterised in that it allows the implementation of the method of the invention as briefly described above.

The invention also relates to:

a device for receiving transmitted data having a receiver adapted to use a packet transmission protocol, which has a decoding device as briefly described above;

a device for receiving transmitted data having a receiver adapted to use the ATM ("Asynchronous Transfer Mode") packet transmission protocol, which has a decoding device as briefly described above;

a device for receiving transmitted data having a receiver adapted to use the packet transmission protocol, on an ETHERNET (registered trade mark) type network, which has a decoding device as briefly described above;

a network station, which has a decoding device as briefly described above;

a device for receiving transmitted data having a receiver for signals transmitted on a wireless channel, which has a decoding device as briefly described above;

a data transmission device having a transmitter adapted to use a packet transmission protocol, which has a coding device as briefly described above;

a data transmission device having a transmitter adapted to use the ATM ("Asynchronous Transfer Mode") packet transmission protocol, which has a coding device as briefly described above;

a data transmission device having a transmitter adapted to use a packet transmission protocol, on an ETHERNET (registered trade mark) type network, which has a coding device as briefly described above;

a device for transmitting data of any type including notably speech, image or multimedia type data, having a transmitter of signals transmitted on a wireless channel, which has a coding device as briefly described above.

This decoding device, this coding device, these storage means, these data receiving devices, these data transmission devices and this network having the same particular characteristics and the same advantages as the coding method as briefly described above, these particular characteristics and these advantages are not repeated here.

The invention will be better understood from a reading of the description which follows, produced with reference to the accompanying drawings in which.

Figure 1:
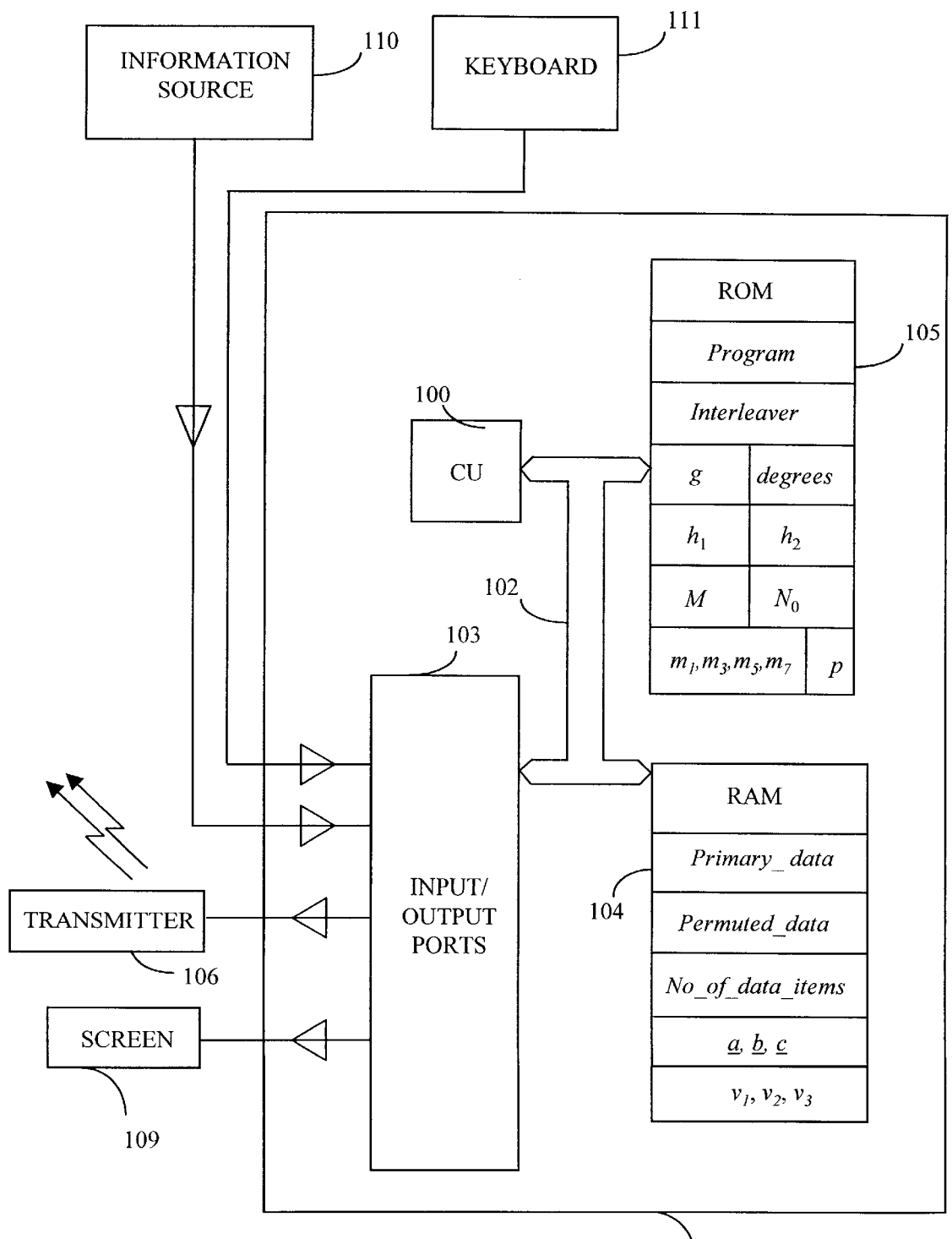
FIG. 1 depicts, schematically, an electronic device incorporating a coder in accordance with the present invention.

In the description which follows, the first check sequence will always be obtained from non-interleaved information sequences, although the scope of the invention also covers the general case in which all the sequences resulting from the coding have been subjected to interleaving.

Before describing a particular embodiment of the present invention, a mathematical presentation of its operation is given below.

By way of example, the choice is made of performing the error correction for an "x to $x^e$" type turbocode, specified by:

$g(x)=1+x+x^4$, (which leads to N0=15), $h_1(x)=1+x+x^2+x^4$, $h_2(x)=1+x^3+x^4$, M=27, (which leads to n=MN0=405), and e=151.

With these conventions, the number of binary symbols contained in a frame is equal to 3×405=1215 and each frame results from the coding of 401 binary symbols $u_i$, referred to as information symbols.

This example was simulated with a channel with Additive White Gaussian Noise ("AWGN") for a number of recurrent decoding steps limited to 7. This simulation was performed until thirty erroneous frames were obtained. After these seven iterations, the frame error probability was around $3\times10^{-4}$. These erroneous frames were then reanalyzed, allowing the decoder to implement up to 40 recurrent steps. Under these conditions it was noticed that, for all these frames, the decoding decision always finished by stabilizing.

For this, only 9 frames required more than 8 iterations, and the frame slowest to stabilize required 18 iterations. After stabilization, 15 frames among the 100,939 tested contained errors.

It is the characteristics of these errors which are now going to be given. Therefore let a(x) be the sequence resulting from the preceding of an information item u(x). This is of the form $a(x)=\Sigma_{i=0 \text{ to } 404} a_i x^i$. Also let â(x) be the estimate of a(x) obtained after decoding of the received frame. This is of the form $â(x)=\Sigma_{i=0 \text{ to } 404} â_i x^i$.

Finally let $y(x)=\Sigma_{i=0 \text{ to } 404} y_i x^i$ be defined as being the sequence of the errors $y_i$, each of these being defined as the sum modulo 2 of $a_i$ and $â_i$: $y_i = a_i + â_i$, y(x)=a(x)+â(x) where + therefore designates addition modulo 2.

This sequence y(x) is referred to as the error sequence corresponding to the transmission of a(x) and the decoding of the received sequence into an estimate â(x) of a(x).

In Table 1, there appears a list of the 15 residual errors mentioned above and given in partially factorized form.

The meaning of the data in this Table 1 is as follows. In the first column there appears an arbitrary indexing i, going from 1 to 15, of the 15 residual errors. In the second column, one possible factorization of the error y(x) is given, using the convention that $(1+x^a+x^b)(x^c+x^d+x^e+x^f)$ is represented by (0, a, b)(c, d, e, f). Thus, for example, the notation (0, 2, 8) (5, 233, 241, 300) refers to the error $y(x)=(1+x^2+x^8)(x^5+x^{233}+x^{241}+x^{300})$ affecting the estimate â(x)=a(x)+y(x) of the precoded sequence a(x).

In the third column, the Hamming weight of y(x), W(y), is given and in the fourth column, the Hamming weight W* of the factor of y(x) indexed by * is given, but only if this Hamming weight is smaller than the Hamming weight of y.

TABLE 1

| i | y (x) | W (y) | W* |
|---|---|---|---|
| 1 | (0, 1, 4) (150, 327, 386)* | 9 | 3 |
| 2 | (0, 1, 4) (84, 143, 312)* | 9 | 3 |
| 3 | (0, 1, 4) (0, 1, 4) (24, 142, 150)* | 7 | 3 |
| 4 | (0, 1, 4) (32, 201, 378)* | 9 | 3 |
| 5 | (0, 1, 4) (38, 97, 266)* | 9 | 3 |
| 6 | (0, 1, 4) (0, 1, 4) (22, 73, 81, 309)* | 10 | 4 |
| 7 | (0, 1, 4) (0, 1, 4) (101, 109, 160, 219)* | 10 | 4 |
| 8 | (0, 1, 4) (0, 1, 4) (126, 303, 362)* | 9 | 3 |
| 9 | (0, 1, 4) (0, 1, 4) (160 162, 164, 166, 170, 176, 292) | 7 | |
| 10 | (0, 1, 4) (150, 209, 378)* | 9 | 3 |

TABLE 1-continued

| iy (x) | W (y) | W* |
|---|---|---|
| 11 (0, 1, 4) (0, 1, 4) (5, 233, 241, 300)* | 10 | 4 |
| 12 (0, 1, 4) (49, 50, . . ., 87, 90, 269, . . . 280) | 10 | |
| 13 (0, 1, 4) (0, 1, 4) (130, 248, 299, 307)* | 10 | 4 |
| 14 (0, 1, 4) (0, 1, 3) (0, 1) (0, 1) (143, 202, 371)* | 12 | 3 |
| 15 (0, 1, 4) (79, 80, . . ., 90, 385, . . ., 397) | 7 | |

It may be seen, in this Table 1, that the weight W* is less than or equal to 4 for 12 of the 15 residual errors, and that case 14 has a slightly different factorization from that of the other eleven cases where the weight W* is less than the weight W(y).

On the basis of the elements described above, the inventors are proposing a concatenated coding method, of which here are the principles.

The format of the information sequence is first reduced to 361 bits:

$$u(x)=\Sigma_{i=0 \text{ to } 360} u_i x^i,$$

and the precoding of $u(x)$ into $a(x)=u(x)+\Sigma_{i=361 \text{ to } 404} a_i x^i$ is performed so as to make $a(x)$ a multiple of $$(1+x+x^4)^2 m_1(x) m_3(x) m_5(x) m_7(x).$$

with $$m_1(x)=1+x^4+x^9,$$

$$m_3(x)=1+x^3+x^4+x^6+x^9,$$

$$m_5(x)=1+x^4+x^5+x^8+x^9,$$

$$m_7(x)=1+x^3+x^4+x^7+x^9,$$

More generally, the precoding makes the polynomial $a(x)$ a non-trivial multiple of $g(x)$, non-trivial meaning that the polynomial $a(x)$ is a multiple of the polynomial $g(x)$ different from $g(x)$.

It should be noted that the product of these four polynomials is the generator polynomial of the BCH code of length 511 and size 475 correcting 4 errors.

The turbocoding of the received sequence is performed in the usual way in order to produce an estimate $â_0(x)$ of the sequence $a(x)$. It should be noted on this subject that, in an ideal decoding procedure, it would be necessary, at this time, to perform sufficient iterations for the estimate $â_0(x)$ to be stabilized.

There are then defined, if the following divisions are carried out exactly:

$$â_1(x)=â_0(x)/(1+x+x^4)$$

$$â_2(x)=â_0(x)/(1+x+x^4)^2$$

and there are decoded, if they exist, the words represented by $â_0(x)$, $â_1(x)$ and $â_2(x)$, as being received words of the abbreviated BCH code mentioned above. Let $b_0(x)$, $b_1(x)$ and $b_2(x)$ be the decoded words corresponding to $â_0(x)$, $â_1(x)$ and $â_2(x)$.

There are then defined:

$$ã_0(x)=b_0(x)$$

$$ã_1(x)=(1+x+x^4)b_1(x)$$

$$ã_2(x)=(1+x+x^4)^2 b_2(x)$$

These three sequences $ã_i(x)$ are coded, by means of the turbocoder, respectively into $t_0$, $t_1$ and $t_2$, and $a(x)$ is estimated as being the $ã_i(x)$ whose coded version $t_i$ is the most likely on the basis of the sequence actually received.

More generally, to implement the present invention, the choice is made of a polynomial $g(x)$ with binary coefficients with a non-null independent term and no multiple factor, the smallest integer N0 such that $g(x)$ divides $(x^{N0}+1)$ is calculated and an odd multiple n of N0, n=M N0, is chosen.

Let $q(x)$ be the generator polynomial of an abbreviated cyclic binary code of length n and correcting s errors, let $p(x)$ be a multiple of $g(x)$ divisible by one or more polynomials of low weight, themselves multiples of $g(x)$. Let $\gamma(x)=q(x) p(x)$.

In the set explained above, the choice had been made of $g(x)=1+x+x^4$, n=405, s=4, $p(x)=(g(x))^2$ and $q(x)=m_1(x) m_3(x) m_5(x) m_7(x)$.

The degree of $\gamma(x)$ is denoted by d and this integer d must be strictly less than n and is generally much less than n in order not to reduce the overall efficiency of the code too much. The information is then represented in the form of a sequence of polynomials $u(x)$ of formal degree n−d−1.

Thus each elementary information "block" is represented by $u(x)=\Sigma_{i=0 \text{ to } n-d-1} u_i x^i$ and it contains n−d information bits $u_i$.

$u(x)$ is then extended in the form $a(x)=u(x)+\Sigma_{i=n-d \text{ to } n-1} a_i x^i$ by adding thereto d binary symbols $a_i$ with the aim of making $a(x)$ divisible by $\gamma(x)$.

Since the degree of $\gamma(x)$ is equal to d, the d binary symbols $a_i$ can be chosen uniquely to make $a(x)$ divisible by $\gamma(x)$.

This precoding of $u(x)$ into $a(x)$ then allows the transmission of $v=[v_1, v_2, v_3]$, the polynomial representation of which is $[a(x), a(x)h_1(x)/g(x), a(x^e)h_2(x)/g(x)]$ where e specifies the interleaver and is assumed to be equal to a power of 2 and where all the polynomial multiplication operations are performed modulo $x^n-1$.

Let r be the received sequence corresponding to the transmission of v. Its decoding is performed as follows.

First of all an estimate $â(x)$ of $a(x)$ is obtained from r by the usual turbodecoding method.

Then let $P0=\{p_1(x), \ldots, p_v(x)\}$ be the set of (so-called low weight) polynomials which are multiples of $g(x)$ and divisors of $p(x)$ which was mentioned above, and let P be the set of polynomials of P0 supplemented by the polynomial $p_0(x)=1$.

Let I be the set of integers i between 0 and v and such that $â(x)$ is divisible by $p_i(x)$.

For any i in I, the polynomial $b_i(x)=â(x)Ip_i(x)$ is first constructed and the word represented by $b_i(x)$ is decoded as being a word received after transmission of a word of the abbreviated cyclic code of length n and of generator polynomial $q(x)$.

Let $b_i^c(x)$ be the version thus corrected of $b_i(x)$ and let $ã_i(x)=p_i(x) b_i^c(x)$.

If no polynomial $ã_i(x)$ with i ∈ I is a multiple of $\gamma(x)$, a decoding error is detected. Otherwise for any polynomial $ã_i(x)$ with i ∈ I, which is a multiple of $\gamma(x)$, the following coded sequence is constructed:

$$t_i=[ã_i(x), ã_i(x)h_1(x)/g(x), ã_i(x^e)h_2(x)/g(x)].$$

The final estimate of the sequence $a(x)$ is then the sequence $ã_i(x)$ for which the transmission of $t_i$ is the most probable given the reception of r. Another estimate consists of choosing the sequence $t_i$ which maximizes the probability of receiving r when $t_i$ was transmitted.

The description given above will be easily generalized to any interleaver preserving the divisibility by $g(x)$ or also to any interleaver guaranteeing that if $a(x)$ is divisible by $g(x)$ then the polynomial obtained after interleaving of a(x) is divisible by another polynomial g'(x).

The inventors have determined the conditions where such an interleaver is possible, both where g'(x) is equal to g(x) and where g'(x) is different from g(x). For the case where g(x)=g'(x), the reference *"Pseudorandom and Self-Terminating Interleavers for Turbo Codes"* by Messrs. HATTORI, J. MURAYAMA and R. MC ELIECE in the reports of the Winter 1998 Information Theory Workshop, San Diego, Calif., 1998 can be consulted.

The choice of the polynomial $\gamma(x)$ can be made using the following remarks.

Let N0 be the smallest integer such that g(x) is a divisor of $X^{N0}+1$. In this case, $\gamma(x)$ can be chosen as being a divisor of $(x^{N0}+1)g(x)$ multiplied by the generator polynomial of an abbreviated BCH code of length n and correcting t errors. The choice of the divisor of $(x^{N0}+1)g(x)$ and the value of t is made by persons skilled in the art on the basis of simulations.

Another choice is to construct, on the basis of simulations, a list of the polynomials which appear often as divisors of the polynomial representing the error, for which the polynomial resulting from this division has a lower weight than the polynomial representing the error before division. The polynomial $\gamma(x)$ is then constructed as being the smallest common multiple of the polynomials in this list.

In the situation described with reference to Table 1, the choice $\gamma(x)=g(x)(1+x)^2(1+x+x^3)m_1(x)m_3(x)m_5(x)$ makes it possible to correct 8 of the 15 errors, namely those mentioned on rows 1, 2, 3, 4, 5, 8, 10 and 14. Similarly the choice $\gamma(x)=g(x)^2(1+x)^2(1+x+x^3)m_1(x)m_3(x)m_5(x)m_7(x)$ makes it possible to correct, in addition, the errors mentioned on rows 6, 7, 11 and 13, and therefore leaves uncorrected only the errors in rows 9, 12 and 15.

A third choice is to construct p(x) as the smallest common multiple of the polynomials which are multiples of g(x) of lower weight than a predetermined value, of degree lower than another predetermined value, and whose constant term is non-null.

The choice of $\gamma(x)$ can depend on the channel and/or on its signal/noise ratio. An effective choice of $\gamma(x)$ consists of defining it as the smallest common multiple of a number of $\gamma_i(x)$, each adapted to a channel or to a signal/noise ratio.

The technical considerations described above are independent of the efficiency of the code and can, consequently, apply equally well to convolutional turbocodes of efficiency less than or equal to 1/3 and to convolutional turbocodes of efficiency greater than 1/3.

The description of a particular embodiment of the present invention will now continue with reference to FIGS. 1 to 10. In this description, the transmission channel used is of the half-duplex type. However, persons skilled in the art can, without difficulty, implement the invention in the case of a full-duplex channel.

FIG. 1 illustrates schematically the composition of a network station or computer coding station, in block diagram form. This station has a keyboard 111, a screen 109, an external information source 110 and a radio transmitter 106, jointly connected to an input/output port 103 of a processing card 101.

The processing card 101 has, interconnected by an address and data bus 102:

a central processing unit 100;

a random access memory RAM 104;

a read-only memory ROM 105;

the input/output port 103;

Each of the elements illustrated in FIG. 1 is well known to persons skilled in the art of microcomputers and transmission systems and, more generally, information processing systems. These common elements are therefore not described here. It should be noted, however, that:

the information source 110 is, for example, an interface peripheral, a sensor, a demodulator, an external memory or another information processing system (not depicted), and is preferentially adapted to provide sequences of signals representing speech, service messages or multimedia data, in the form of sequences of binary data, the radio transmitter 106 is adapted to use a packet transmission protocol on a wireless channel, and to transmit these packets on such a channel.

It should be noted, moreover, that the word "register" used in the description designates, in each of the memories 104 and 105, both a memory area of small capacity (a few binary data items) and a memory area of large capacity (allowing storage of a complete program).

Figure 5:
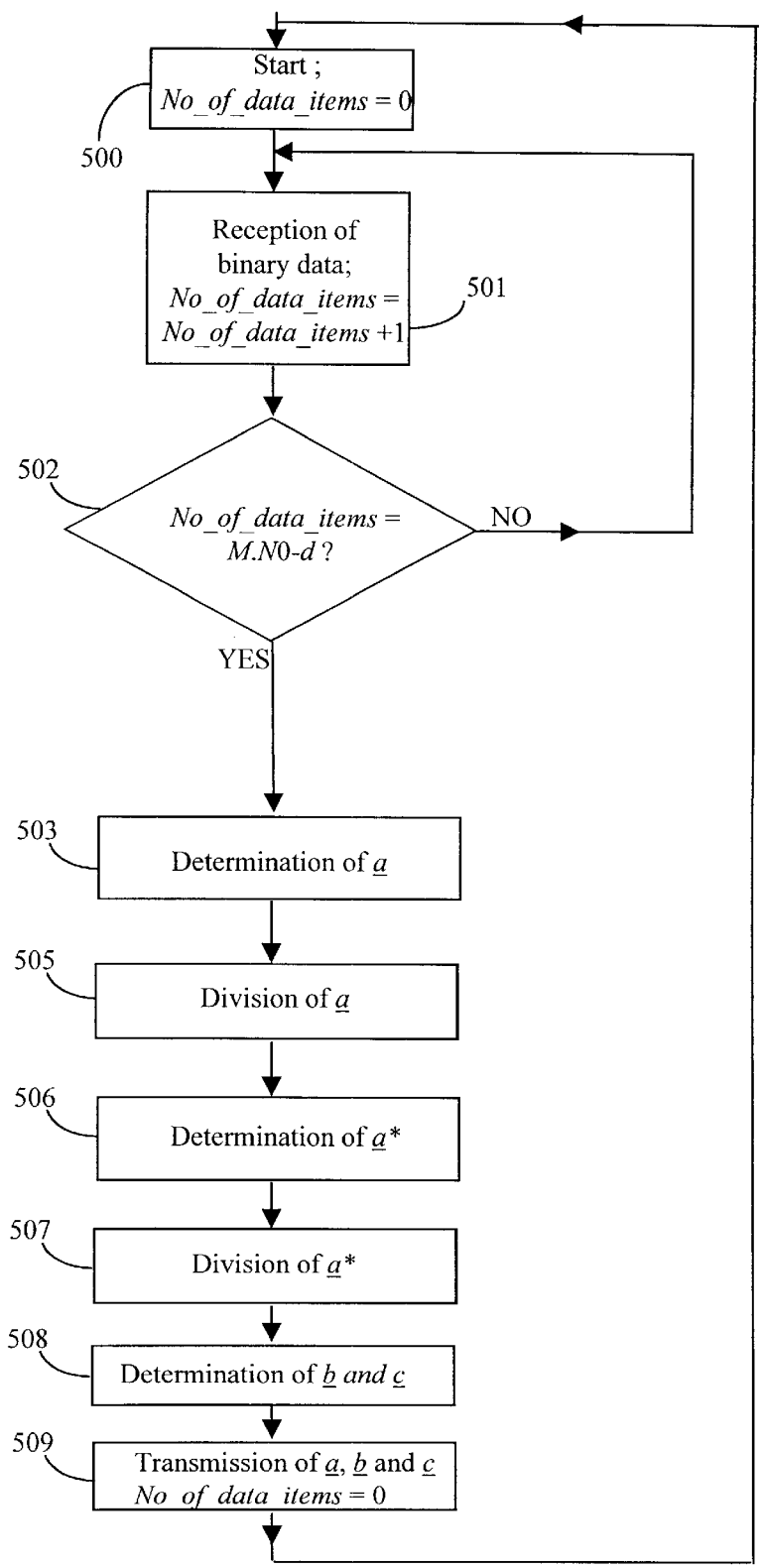
FIG. 5 depicts, schematically, a flow diagram of the operation of a coder as illustrated in FIG. 1.

The random access memory 104 stores data, variables and intermediate processing results, in memory registers having, in the description, the same names as the data whose values they store. The random access memory 104 has notably:

a register "primary_data" in which are stored, in the order of their arrival on the bus 102, the binary data items coming from the information source 110, in the form of a sequence u, next supplemented to form a sequence a, a register "no_of_data_items" which stores an integer number corresponding to the number of binary data items in the register "primary_data", a register "permuted_data" in which are stored, in the order of their arrival on the bus 102, the permuted binary data items, as described with reference to FIG. 5, in the form of a sequence a*, a register "a, b, c" in which are stored, in the order of their determination by the central unit 100, the binary data items of sequences in the course of processing, and a register "$v_1, v_2, v_3$" in which are stored the sequences to be transmitted.

The read-only memory 105 is adapted to store, in registers which, for convenience, have the same names as the data they store:

the operating program of the central processing unit 100, in a register "program", the sequence g, in a register "g", the sequence p, in a register "p", the degree m of g(x) and the degree d of $\gamma(x)$, in a register "degrees", the sequences $m_1, m_3, m_5$ and $m_7$, in a register "$m_1, m_3, m_5, m_7$", the sequence $h_1$, in a register "$h_1$", the sequence $h_2$, in a register "$h_2$", the value of N0, in a register "N0", the value of M, in a register "M", and the table defining the interleaver, in a register "interleaver".

The central processing unit 100 is adapted to implement the flow diagram described in FIG. 5.

As a variant, a part or the whole of the operating program of the central processing unit 100 may be stored in a removable storage medium, such as a floppy disk, a CD-ROM, a DVD, a memory card, or any other removable storage medium.

Figure 2:
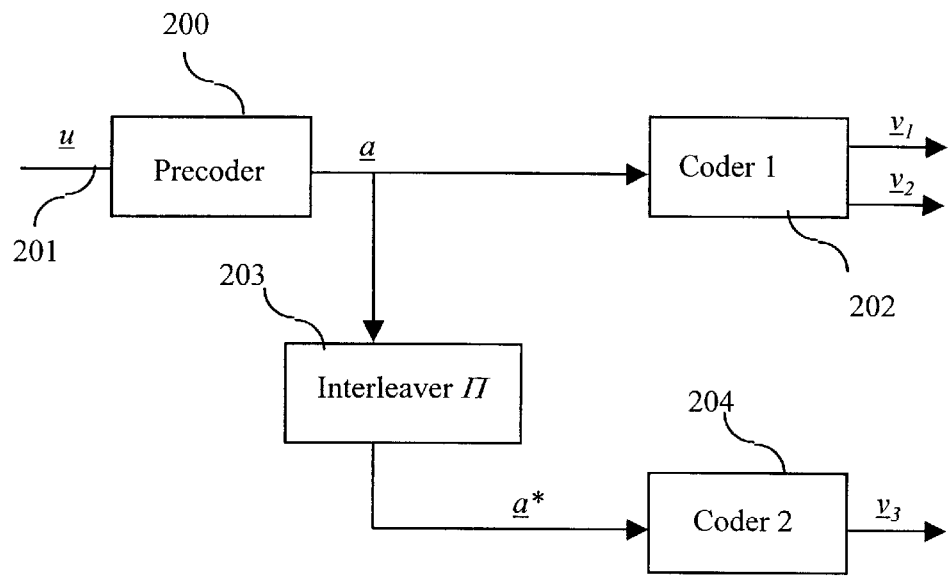
FIG. 2 depicts, in block diagram form, a turbocoding device corresponding to a parallel convolutional turbocode in accordance with the present invention.

It may be seen, in FIG. 2, that a turbocoding device corresponding to a parallel convolutional turbocode, in accordance with the present invention, has essentially:

an input of symbols to be coded 201, where the information source 110 provides a sequence of binary symbols to be transmitted, or "to be coded", u, a precoder 200 which provides, from the sequence u, a sequence a whose polynomial representation, a(x), is divisible by $\gamma(x)=(g(x))^2 m_1(x)m_3(x)m_5(x)m_7(x)$, a first coder 202 which provides, from the sequence a, two sequences $v_1$ and $v_2$ of symbols representing the sequence a, an interleaver 203 which provides, from the sequence a, an interleaved sequence a*, the symbols of which are the symbols of the sequence a, but in a different order, and a second coder 204 which provides, from the interleaved sequence a*, a third sequence, $v_3$, representing the sequence a.

The three sequences $v_1$, $v_2$ and $v_3$ are transmitted in order to be next decoded.

The remainder of the description is concerned preferably with "x to $x^e$" type interleavers, although the present invention is not limited to this type of interleaver but concerns, more generally, all interleavers used in turbocodes and preferably those which, 1/ from sequences $a_i$ having:
  a polynomial representation $a_i(x)$ which is a multiple of a polynomial $g_i(x)$, and
  a number of binary data items equal to the product of the integer number M and the integer N0, the smallest integer such that the polynomial $x^{N0}+1$ is divisible by each divisor polynomial $g_i(x)$;

2/ produce so-called "permuted" sequences $a_{ij}^*$, (i=1, . . ., K; j=1, . . . , M1), each sequence $a_{ij}^*$
  being obtained by a permutation of the corresponding sequence $a_i$, the said permutation being, in a representation where the binary data items of each sequence $a_i$ are written, row by row, into a table with N0 columns and M rows, the result of any number of so-called elementary permutations, each of which:
    either has the property of transforming the cyclic code of length N0 and of generator polynomial $g_i(x)$ into an equivalent cyclic code of generator polynomial $g_{ij}(x)$ which may be equal to $g_i(x)$, and acts by permutation on the N0 columns of the table representing $a_i$,
    or is any permutation of the symbols of a column of the said table; and
  having, in consequence, a polynomial representation $a_{ij}^*(x)$ which is equal to a polynomial product $c_{ij}(x) g_{ij}(x)$,
  at least one permuted sequence $a_{ij}^*$ being different from the corresponding sequence $a_i$, 3/ so that elementary coders produce redundant sequences whose polynomial representation is equal to $\Sigma f_{ij}(x) c_{ij}(x)$, for j=1, . . . , M1, each polynomial $f_{ij}(x)$ being a polynomial of degree at most equal to the degree of the polynomial $g_{ij}(x)$ with the same indices i and j.

These interleavers are said to "maintain divisibility".

The first coder, 202, is a systematic coder, that is to say the sequence $v_1$ is identical to the sequence a.

Finally, the turbocode uses, in each of the two elementary coders, a divisor polynomial g(x) which, on the one hand, is of "period N0", which means that N0 is the smallest integer such that g(x) is a divisor of the polynomial $x^{N0}+1$, and, on the other hand, is of degree m.

Figure 3:
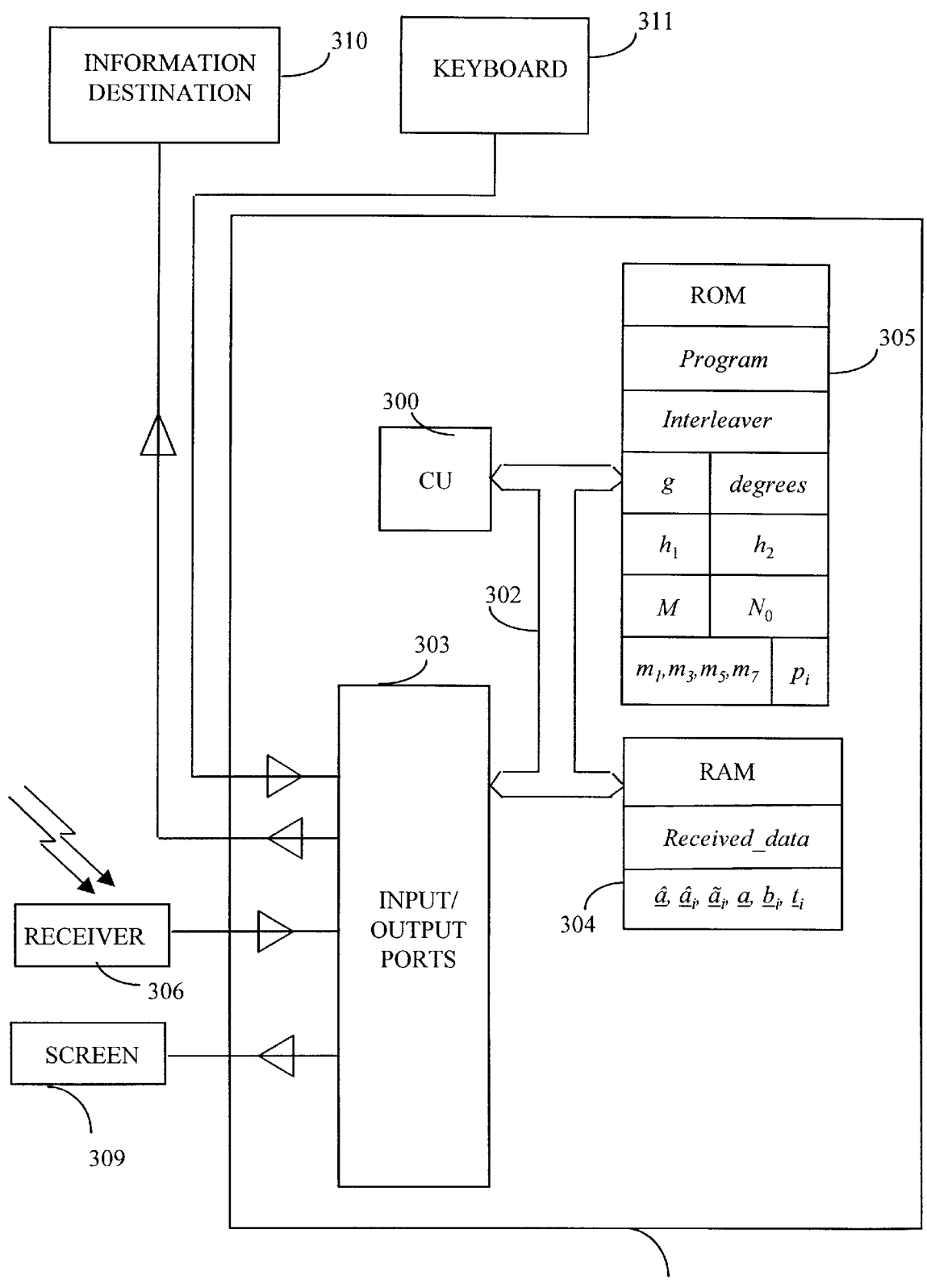
FIG. 3 depicts, schematically, an electronic device incorporating a decoder in accordance with the present invention.

FIG. 3 illustrates schematically the composition of a network station or computer coding station, in block diagram form. This station has a keyboard 311, a screen 309, an external information destination 310 and a radio receiver 306, jointly connected to an input/output port 303 of a processing card 301.

The processing card 301 has, interconnected by an address and data bus 302:

a central processing unit 300;

a random access memory RAM 304;

a read-only memory ROM 305; and the input/output port 303.

Each of the elements illustrated in FIG. 3 is well known to persons skilled in the art of microcomputers and transmission systems and, more generally, information processing systems. These common elements are therefore not described here. It should be noted, however, that:

the information destination 310 is, for example, an interface peripheral, a display, a modulator, an external memory or another information processing system (not depicted), and is preferably adapted to receive sequences of signals representing speech, service messages or multimedia data, in the form of sequences of binary data, the radio receiver 306 is adapted to use a packet transmission protocol on a wireless channel, and to receive these packets on such a channel.

It should be noted, moreover, that the word "register" used in the description designates, in each of the memories 304 and 305, both a memory area of small capacity (a few binary data items) and a memory area of large capacity (allowing storage of a complete program).

The random access memory 304 stores data, variables and intermediate processing results, in memory registers having, in the description, the same names as the data whose values they store. The random access memory 304 has notably:

a register "received_data" in which are stored, in the order of their arrival on the bus 302, the binary data items coming from the transmission channel, in the form of a sequence, and a register "â, $\tilde{a}_i$, $\hat{a}_i$, a, $b_i$, $t_i$,", in which are stored sequences whose meaning is described below, with reference to FIG. 6.

The read-only memory 305 is adapted to store, in registers which, for convenience, have the same names as the data they store:

the operating program of the central processing unit 300, in a register "program", the sequence g, in a register "g", the sequences $m_1$, $m_3$, $m_5$ and $m_7$, in a register "$m_1$, $m_3$, $m_5$, $m_7$", the degree m of g(x) and the degree d of $\gamma(x)$, in a register "degrees"

the sequence $h_1$, in a register "$h_1$", a register "$p_i$", in which are stored sequences $p_i$ whose meaning is described below, with reference to FIG. 6, the sequence $h_2$, in a register "$h_2$", the value of N0, in a register "N0", the value of M, in a register "M", and the table defining the interleaver, in a register "interleaves".

Figure 6:
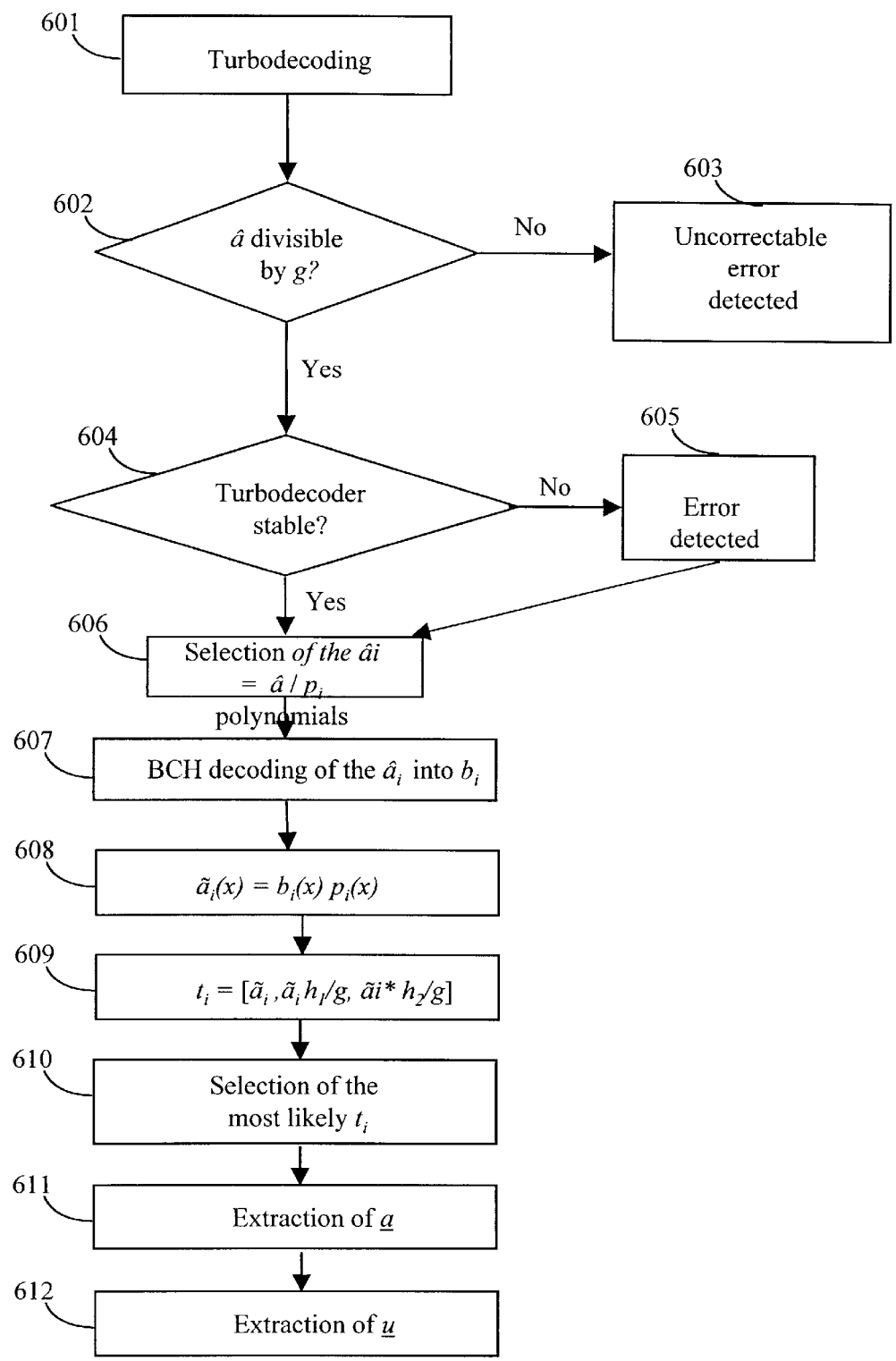
FIG. 6 depicts, schematically, a flow diagram of the decoding and error correction in accordance with the present invention, implemented by the decoding device illustrated in FIG. 3.

The central processing unit 300 is adapted to implement the flow diagram described in FIG. 6.

As a variant, a part or the whole of the operating program of the central processing unit 300 may be stored in a removable storage medium, such as a floppy disk, a CD-ROM, a DVD, a memory card, or any other removable storage medium.

Figure 4:
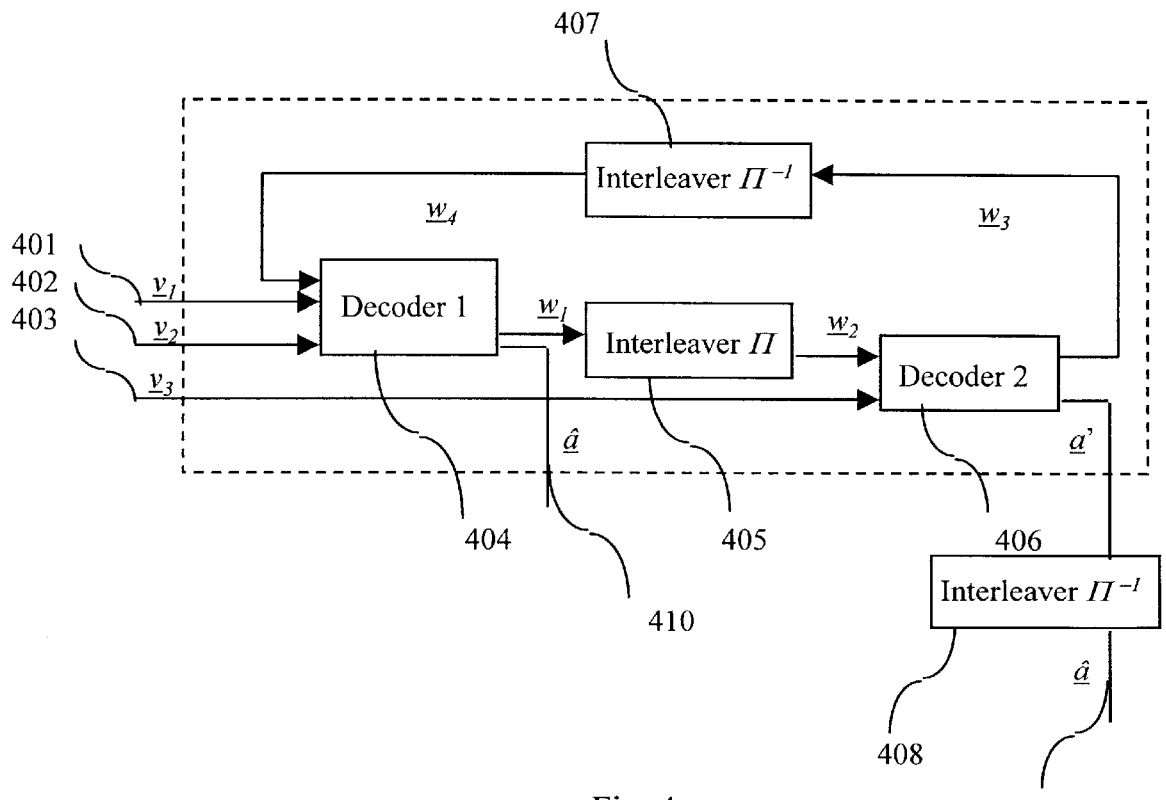
FIG. 4 depicts, in block diagram form, a turbodecoding device corresponding to a parallel convolutional turbocode in accordance with the present invention.

In FIG. 4, it may be seen that a decoding device is essentially composed of:

three inputs 401, 402 and 403 of sequences representing $v_1$, $v_2$ and $v_3$, which, for convenience, are also denoted by $v_1$, $v_2$ and $v_3$, the received sequence composed of these three sequences being denoted by r, a first "soft input/output" decoder 404, corresponding to the coder 202 (FIG. 2) and receiving the sequences $v_1$ and $v_2$ as well as an extrinsic information sequence $w_4$ described later, provides an a posteriori estimation sequence $w_1$, an interleaver 405, identical to the interleaver 203 used in the coder, which receives the sequence $w_1$ and interleaves it into a sequence $w_2$, a second soft input/output decoder 406, corresponding to the coder 204 and receiving the sequences $w_2$ and $v_3$, which provides, on the one hand, an extrinsic information sequence $w_3$ and, on the other hand, an estimated sequence a', a de-interleaver 408, the inverse of the interleaver 405, receiving the sequence a' and providing an estimated sequence â, on an output 409, a de-interleaver 407, the inverse of the interleaver 405, receiving the sequence $w_3$ and providing the sequence $w_4$, and an output 410 of an estimated sequence â, at the output of the decoder 404.

An estimated sequence â is taken into account only following a predetermined number of iterations (see the article *"Near Shannon limit error-correcting coding and decoding: turbocodes"* cited above).

In the preferred embodiment (interleavers which maintain divisibility), the decoders 404 and 406 are initialized taking into account the fact that the coders 202 and 204 each have a null initial state and final state.

In FIG. 5, which depicts the operation of a coder such as illustrated in FIG. 1, it may be noted that, after an initialization operation 500, during which the registers of the random access memory 104 are initialized (no_of_data_items="0"), during an operation 501, the central unit 100 waits to receive, and then receives a binary data item to be transmitted, positions it in the random access memory 104 in the register "primary_data" and increments the counter "no_of_data_items".

Next, during a test 502, the central unit 100 determines whether or not the integer number stored in the register "no_of_data_items" is equal to the product M.N0 from which d is subtracted (M, N0 and d being values stored in the read-only memory 105).

When the result of the test 502 is negative, the operation 501 is reiterated. When the result of the test 502 is positive, during an operation 503, u(x) is extended in the form $a(x) = u(x) + \sum_{i=361 \text{ to } 404} a_i x^i$ by adding 44 binary data items $a_i$ with the aim of making a(x) divisible by $\gamma(x) = (g(x))^2 m_1(x) m_3(X) m_5(x) m_7(x)$, where $m_1(x)$ is the minimum polynomial of a primitive element $\alpha$ of the Galois field $GF(2^9)$ and therefore has a degree equal to 9, and each other $m_i(x)$ is the minimum polynomial of an element $\alpha^i$ and has a degree equal to 9, and g(x) is the polynomial $1+x+X^4$.

Since the degree of $\gamma(x)$ is equal to 44, the 44 binary data items can be selected in a one-to-one manner in order to obtain the property that a(x) is divisible by $\gamma(x)$.

Next, during an operation 505, the central unit 100 performs the division of a(x) by g(x) and the resulting sequence b is stored in the register "a, b, c".

Then, during an operation 506, the binary data items of the sequence a are successively read from the register "a, b, c", in the order described by the table "interleaves" stored in the read-only memory 105. The data which result successively from this reading are placed in memory in the register "permuted_data" of the random access memory 104.

Next, during an operation 507, the division is performed of the polynomial a*(x) associated with the sequence of permuted binary data items stored in the register "permuted_data", by the polynomial g(x). The result of this division is placed in memory in the register "a, b, c", and corresponds to the binary data items of the sequence c.

During an operation 508, the sequences $v_2$ and $v_3$ are determined by performing respectively the product of the polynomials associated with the sequences b and c stored in the register "a, b, c" of the random access memory 104, and the generator polynomials $h_1(x)$ and $h_2(x)$.

During an operation 509, the sequences $v_1=a$, $v_2$, and $v_3$ are transmitted using, to that end, the transmitter 106. Next, the registers of the memory 104 are again initialized, in particular the counter no_of_data_items is reset to "0" and the operation 501 is reiterated.

In a variant, during the operation 509, the sequence $v_1$ is transmitted in full, but only a subset, for example one data item out of two, of each of the sequences $v_2$ and $v_3$ is transmitted. This variant is known to persons skilled in the art by the name puncturing.

Thus, according to one aspect of the present invention, the method of coding a sequence of information symbols of polynomial representation u(x), includes:

a turbocoding operation (505 to 508), and an operation of transmitting (509), on a transmission channel, the sequence resulting from the turbocoding operation, and also includes, as a preliminary to the said turbocoding operation, at least one precoding operation (503) during which there are added, to the said sequence u(x), redundant symbols which guarantee the divisibility of the precoded sequence by at least one predetermined polynomial which is:

a non-trivial multiple of the divisor polynomial used by the coder of the said turbocoder, a coder which acts on the precoded sequence, and which is among the polynomials which have a high probability of dividing the polynomial representing a transmission error on the said channel.

FIG. 6 gives a flow diagram of turbodecoding and error correction implemented by a device such as illustrated in FIG. 3.

A received sequence r(x) is first turbodecoded according to techniques known to persons skilled in the art, during an operation 601, using a predetermined number of iterations, for example equal to 7.

In this respect, it should be noted that, knowing the polynomials g(x), $h_1(x)$, $h_2(x)$ and the interleaver which, from the sequence a, provide the permuted sequence a*, persons skilled in the art know how to, with no technical problem, implement the decoder adapted to the decoding and correction of errors affecting the triplet of sequences ($v_1$, $v_2$, $v_3$), using the interleaver considered above and, possibly, the corresponding de-interleaver.

To that end, the following can be referred to:

the article by Messrs. L. R. BAHL, J. COCKE, F. JELINEK and J. RAVIV entitled *"Optimal decoding of linear codes for minimizing symbol error rate"*, published in the journal IEEE Transactions on Information Theory, in March 1974, which describes a so-called "BJCR" algorithm generally used in relation to turbocodes;

the article by Messrs. J. HAGENAUER, E. OFFER and L. PAPKE entitled "*Iterative decoding of binary block and convolutional codes*" published in the journal IEEE Transactions on Information Theory, in March 1996;

the article by Messrs. J. HAGENAUER and P. HOEHER entitled "*A Viterbi algorithm with soft decision outputs and its applications*", published with the reports of the IEEE GLOBECOM conference, pages 1680–1686, in November 1989;

the article by Messrs. J. HAGENAUER, P. ROBERTSON and L.

PAPKE entitled "*Iterative (turbo)decoding of systematic convolutional codes with the MAP and SOVA algorithms*", published by the journal lnformationstechnische Gesellschaft (ITG) Fachbericht, pages 21–29, October 1994; and the article by Messrs. C. BERROU, S. EVANO and G. BATTAIL, entitled "*Turbo-block-codes*" and published with the reports of the "Turbocoding" seminar organized by the Institute of Technology in Lund (Sweden) (Department of Applied Electronics) in August 1996.

The operation 601 thus provides:

an estimate â of the so-called "current" precoded sequence a, which results from the predetermined number of iterations, on one of the outputs 407 or 409 and at least one so-called "previous" estimate of the precoded sequence a, which results from an intermediate decoding result.

In the preferred embodiment (interleavers which maintain divisibility), the "previous" estimates are provided equally well on either of the outputs 407 or 409. On the other hand, when only one of the coders 202 or 204 has a guaranteed return to zero, that is to say when the final state of this coder is always null, it being considered that its initial state is null, the current estimate and each previous estimate originate preferentially from the output of the decoder corresponding to this coder. In each of these cases, the previous estimates are the latest which precede the current estimate.

Next, during a test 602, the central unit 300 determines whether or not the polynomial representation â(x) of the estimate â is divisible by the generator polynomial g(x), by performing the division under consideration and determining whether or not the remainder is null.

When the result of the test 602 is negative, a decoding error is detected and it is here considered incapable of being corrected, and the processing of this error is performed during an operation 603 according to known methods. When the result of the test 602 is positive, during a test 604, the central unit 300 determines whether or not the turbodecoding is stable, by comparing each previous estimate and the current estimate â.

When these estimates are different, the result of the test 604 is negative and, during an operation 605, the processing of this error is performed (typically the degree of reliability of the sequence which will possibly result from the operation 608, below, is considered to be lower).

When the result of the test 604 is positive or following the operation 605, during an operation 606, with:

$p_0=1$,
$p_1=g$,
$p_2=g^2$, a selection is made of the values of i between 0 and 2 for which $â_i=â/p_i$ is a polynomial, and the said polynomials $â_i$ are stored.

Next, during an operation 607, each of the selected sequences $â_i$ is subject to the BCH decoding associated with the BCH code mentioned above. The corrected sequences are denoted by $b_i$.

During an operation 608, the central unit 300 determines the sequences $\tilde{a}_i$ whose polynomial representations satisfy the equations:

$$\tilde{a}_i(x)=b_i(x)p_i(x).$$

During an operation 609, the central unit 300 produces the encoded sequences $t_i(x)=[\tilde{a}_i(x), \tilde{a}_i(x) h_1(x)/g(x), \tilde{a}_i(x^e) h_2(x)/g(x)]$.

During an operation 610, the sequences $t_i$ are compared with the received sequence r(x) and the sequence $t_i$ closest to r is considered as the final estimate of the sequence $[v_1, v_2, v_3]$ assigned a reliability coefficient which is:

proportional to the distance between the selected sequence $t_i$ and the sequence r, and lower if the result of the test 604 was negative than if it was positive.

During an operation 611, the final estimate of the sequence $a=\tilde{a}_i$ is extracted from the sequence $t_i$.

During an operation 612, the binary data items added during the precoding (operation 503) are removed from the finally estimated sequence a, in order to provide the sequence of transmitted data u which is transmitted to the information destination 310, with the reliability coefficient mentioned above. In a variant, the test 604 and the operation 605 are eliminated. In a variant, no reliability coefficient is determined. In a variant, only the reliability coefficient resulting from the operation 605 is considered.

Figure 7:
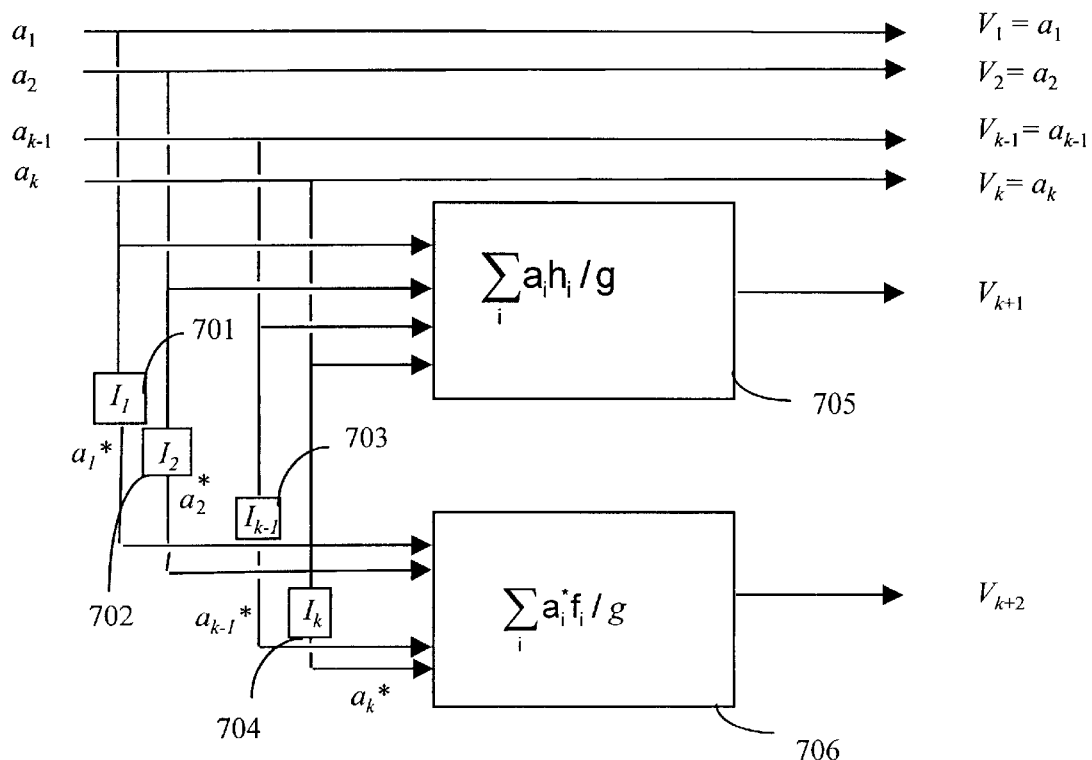
FIG. 7 depicts, schematically, a coder in accordance with a variant of the present invention.

FIG. 7 gives an illustration of a coder carrying out this operation. In this figure, it may be seen that, for K sequences of symbols at the input, the coder transmits, at the output:

these K sequences of symbols in an identical form, a sequence of check symbols formed by summing the products of the polynomials associated with the information sequences $a_i$ and predetermined polynomials $h_i$ and dividing this sum by a predetermined polynomial g (coder 701);

a sequence of check symbols formed by first interleaving each information sequence $a_i$ by means of an interleaver $I_i$ maintaining divisibility by g (interleavers 702 to 705) in order to provide a sequence $a_i^*$, then summing the products of the polynomials associated with the sequences $a_i^*$ and predetermined polynomials $f_i$ and dividing this sum by the said predetermined polynomial g (coder 706).

In a variant, not depicted:

interleavers $I_i$ are used which guarantee that, if $a_i$ is divisible by g, then the polynomial obtained after interleaving of $a_i$ is divisible by another predetermined polynomial g', and the coder 706 uses, as the divisor polynomial, the said polynomial g'.

Figure 8:
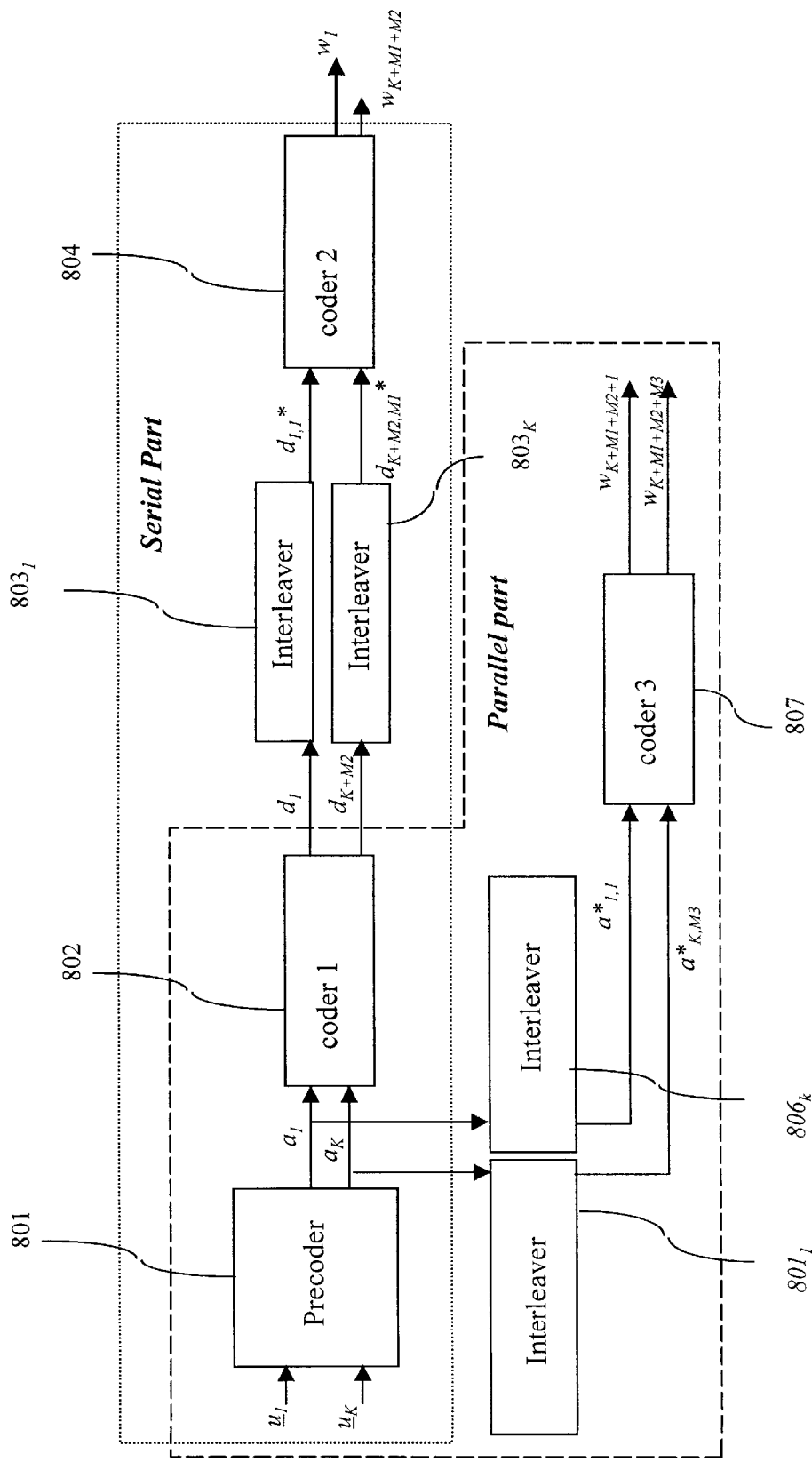
FIG. 8 depicts a turbocoder corresponding to a hybrid convolutional turbocode in accordance with the present invention.

In FIG. 8, it may be seen that, in accordance with the present invention, a hybrid turbocoder is composed of a precoder 801, which receives K sequences of symbols to be transmitted $u_j$ and extends each $u_j(x)$ in the form $a_j(x)=u_j(x)+\Sigma_{i=361 \text{ to } 404} a_{ij}x^i$ by adding 44 binary data items $a_{ij}$ with the aim of making $a_j(x)$ divisible by $\gamma(x)=(g(x))^2 m_1(x)m_3(x)m_5(x)m_7(x)$;

a first convolutional coder 802, which provides, from the K sequences $a_j$, K+M2 so-called "intermediate" sequences $d_j$, representing the sequences $v_j$, interleavers $803_1$ to $803_{K+M2}$, the interleaver $803_j$ (for j between 1 and K+M2) providing, from the sequence $d_j$, M1 so-called "permuted" interleaved sequences $d_{jl}$ (for I between 1 and M1), the symbols of which are the symbols of the sequence $d_j$, but in different orders;

a second convolutional coder 804, which provides, from the (K+M2)*M1 interleaved sequences $d_{jl}$, K+M1+M2 so-called "coded" sequences $w_l$ representing the K sequences $a_i$, interleavers 806$_1$ to 806$_K$, the interleaver 806$_i$ (for i going from 1 to K) providing, from the sequences $a_i$, M3 so-called "permuted" interleaved sequences $a^*_{ij}$ (for j going from 1 to M3), the symbols of which are the symbols of the sequence $a_i$, but in different orders, and a third convolutional coder 807, which provides, from the K*M3 interleaved sequences $d_{ij}$, M3 so-called "coded" sequences $w_i$ representing the K sequences $a_i$.

In order to be better acquainted with serial or hybrid turbocodes, persons skilled in the art can refer to the articles "*Serial concatenation of interleaved codes: Performance analysis, design and iterative decoding*", BENEDETTO, MONTORSI, (Univ. Politecnico di Torino, Italy), DIVSALAR, POLLARA, (JPL, USA), TDA progress report, 42–126, August 1996; and "*Hybrid concatenated codes and iterative decoding*", DIVSALAR, POLLARA, (JPL, USA), TDA progress report, 42–130, August 1997, as regards serial or hybrid turbocoding.

The K+M1+M2+M3 coded sequences $w_i$ are encapsulated in radio frames and transmitted on a wireless transmission channel in order to be next decoded.

Preferably, all the interleavers have the characteristics described with reference to FIG. 2 (interleavers which maintain divisibility) and, more preferentially, are of the "x to $x^e$" type.

In a preferred embodiment, the third coder, 807, is a systematic coder.

For decoding the signals transmitted by the hybrid turbocoder illustrated with reference to FIG. 8, it should be noted here that use is made of a turbodecoder using interleavers and de-interleavers having the same characteristics as the interleavers of the turbocoder.

In the preferred embodiments (interleavers which maintain divisibility), the decoders are initialized taking into account the fact that the coders 802, 804 and 807 each have a null initial state and final state.

Figure 9:
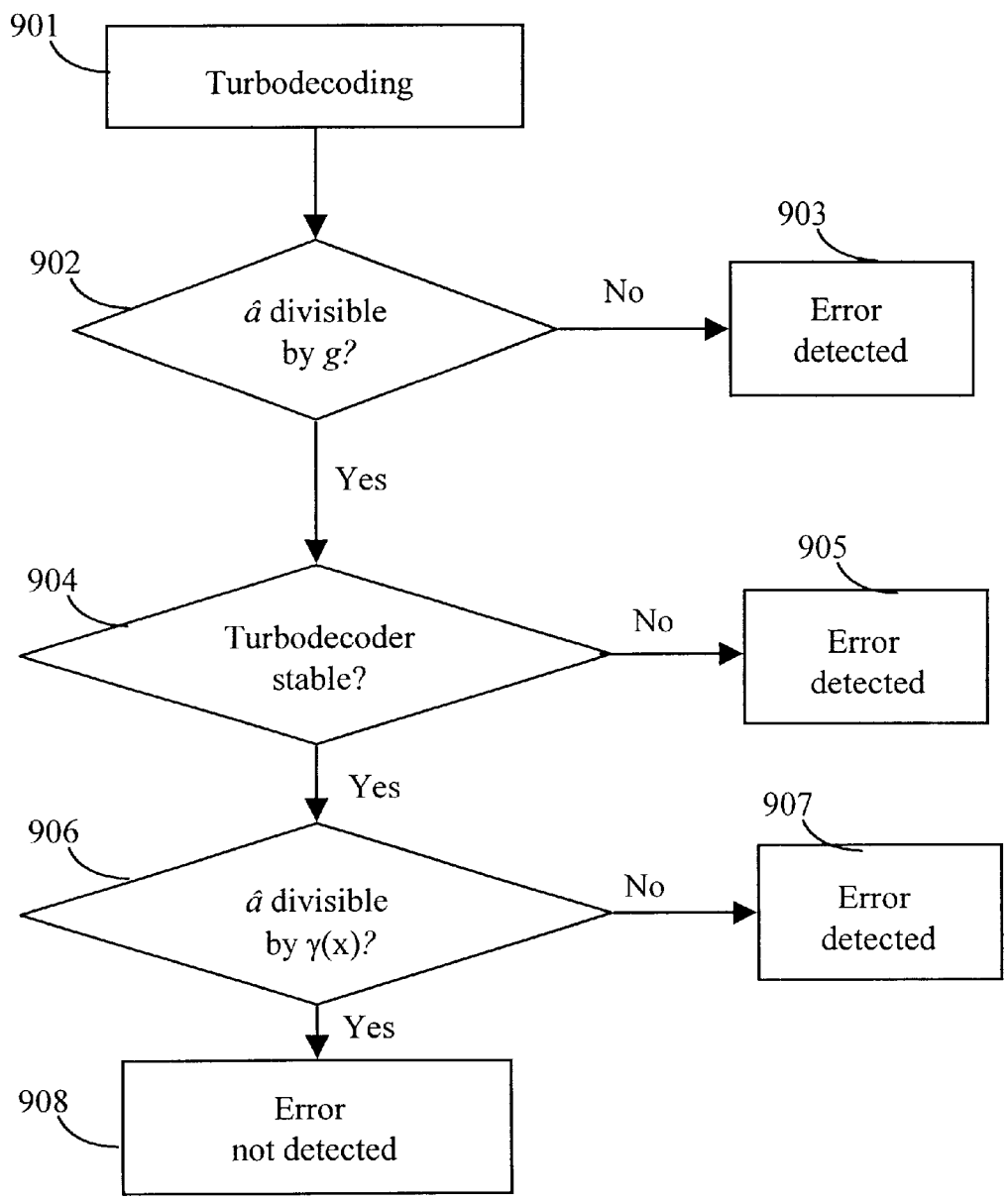
FIG. 9 depicts, schematically, a flow diagram of the decoding and error detection in accordance with the present invention, implemented by the decoding device illustrated in FIG. 3.

FIG. 9 gives a flow diagram of turbodecoding and error detection implemented by a device such as illustrated in FIG. 3.

A received sequence r is first turbodecoded according to techniques known to persons skilled in the art, during an operation 901, using a predetermined number of iterations, for example equal to 7.

It should be noted here that, in the preferred embodiment (interleavers which maintain divisibility), the estimate resulting from the decoding is provided equally well on either of the outputs 407 or 409. On the other hand, when only one of the coders 202 or 204 has a guaranteed return to zero, the estimate to be processed originates from the output of the decoder corresponding to this coder. In each of these cases, previous estimates are provided as explained with reference to FIG. 6.

This operation provides an estimate â of the precoded sequence a. Next, during a test 902, the central unit 300 determines whether or not the polynomial representation â(x) of the estimate â is divisible by the generator polynomial g(x), by performing the division under consideration and determining whether or not the remainder is null.

When the result of the test 902 is negative, a decoding error is detected and the processing of this error detection, of known type, is performed during an operation 903. When the result of the test 902 is positive, during a test 904, the central unit 300 determines whether or not the turbodecoding is stable, in a manner identical to the procedure carried out during the operation 604, FIG. 6.

When the result of the test 904 is negative, during an operation 905, a decoding error is detected and the processing of this error detection is performed. When the result of the test 904 is positive, during a test 906, the central unit 300 determines whether or not the polynomial representation â(x) of the sequence â is divisible by $g(x)m_1(x)m_3(x)m_5(x)m_7(x)$.

In a variant, during an operation 503, u(x) is extended in the form $a(x)=u(x)+\Sigma_i a_i x^i$ by adding binary data items $a_i$ with the aim of making a(x) divisible by $\gamma(x)=h(x)$, where h(x) is any polynomial. In accordance with this variant, during the operation 906, the central unit 300 determines whether or not the polynomial representation â(x) of the sequence â is divisible by h(x).

When the result of the test 906 is negative, during an operation 907, this error is processed, in a known manner. When the result of the test 906 is positive, the estimated sequence â is considered as the final estimate of the precoded sequence a. During an operation 908, the binary data items added during the precoding (operation 503) are removed from the finally estimated sequence in order to provide the sequence of transmitted data u which is transmitted to the information destination 310.

In a variant, not depicted, particularly adapted to the case of the use of interleavers which maintain divisibility, the operations 902 and 903 are removed.

Thus, in accordance with one aspect of the present invention, the decoding method takes into account:

at least one predetermined polynomial, and a received sequence r capable of being the result of the coding of a sequence of information symbols of polynomial representation u(x) representing a physical quantity, the coding including a turbocoding, and guaranteeing the divisibility of a sequence to be turbocoded, a(x) representing the sequence u(x), by each predetermined polynomial, and includes:

an operation of turbodecoding (601, 901) the received sequence r into an estimated sequence â, at least one operation of calculating the remainder (602, 606, 902, 906) of the division of the polynomial representation â(x) of the estimated sequence â, by a said predetermined polynomial.

In accordance with another aspect of the present invention, the decoding method takes into account:

at least one predetermined polynomial, and a received sequence r capable of being the result of the coding of a sequence of information symbols of polynomial representation u(x) representing a physical quantity, the coding including a turbocoding, and guaranteeing the divisibility of a sequence to be turbocoded, a(x) representing the sequence u(x), by each predetermined polynomial, and includes:

an operation of verifying the stability of turbodecoding (604, 904) of the received sequence r into an estimated sequence â, during which it is determined whether or not the turbodecoding is stable.

Figure 10:
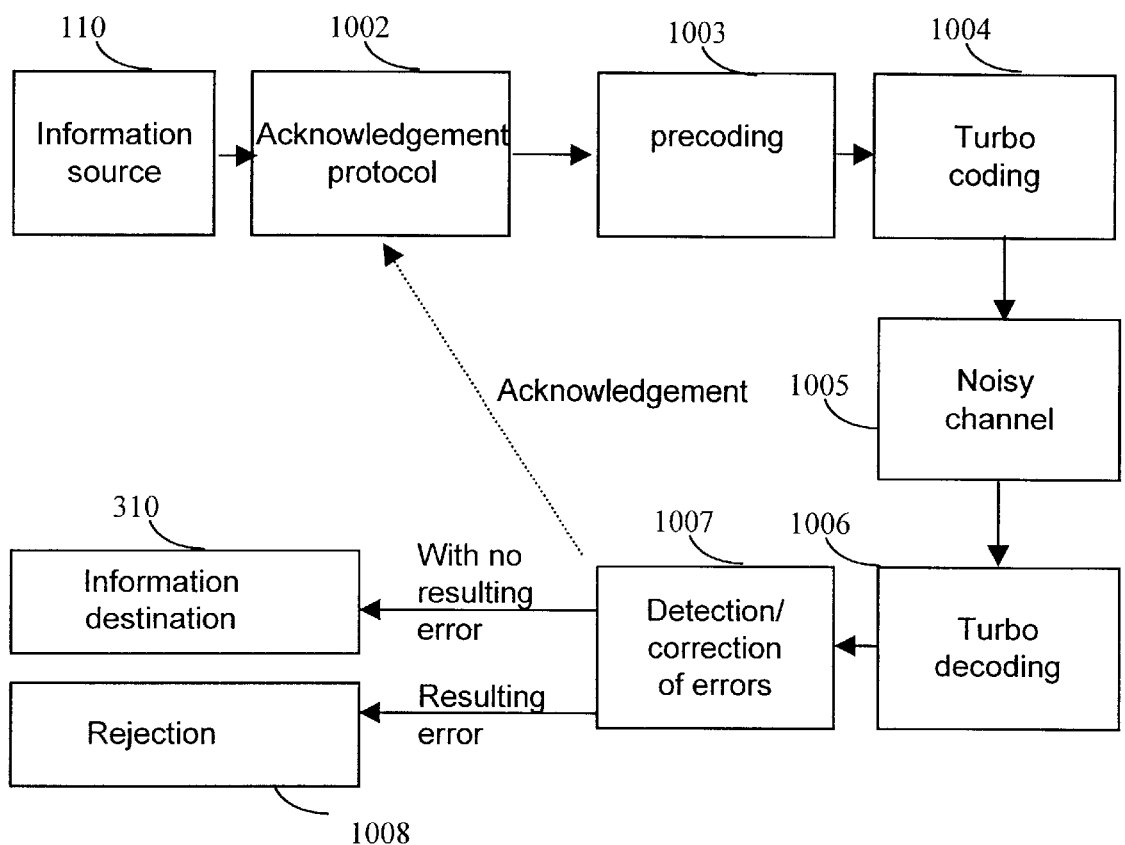
FIG. 10 depicts a general functional block diagram of a system using one of the algorithms described with reference to FIGS. 6 and 9.

As may be seen with reference to FIG. 10, the general functional block diagram of a system using one of the algorithms described with reference to FIGS. 6 and 9 includes successively:

a) on the transmitter side:
   the information source 110
   the acknowledgement processing protocol 1002 (see operations 603, 903, 905 and 907), this protocol possibly including a procedure of retransmitting sequences for which no acknowledgement message is received from the receiving device, within a predetermined time,
   the precoding 1003 (see operation 503),
   the turbocoding 1004 (operations 505 to 509),
   the transmission and reception 1005 on the noisy transmission channel, and
b) on the receiver side,
   the turbodecoding 1006 (see operations 601 or 901),
   the detection or correction of errors (see operations 902 to 908 or respectively, 602 to 611), and
   when a detected error is not corrected (operations 603, 903, 905 and 907), no acknowledgement message is transmitted, in accordance with the protocol 1002, and the received sequence r is rejected, operation 1008, and
   when either no error is detected (operation 908), or the detected errors are corrected (operation 608), transmission to the information destination 310 is performed, as well as transmission of an acknowledgement message in accordance with the protocol 1002, to the coding device 101.

It should be noted that the use of an acknowledgement protocol dictates that the information destination has some means or other of transmitting this acknowledgement and that the information transmitter has a means of receiving this acknowledgement, the said means being well known to persons skilled in the art of transmissions.

What is claimed is:

1. A method of coding a sequence of information symbols of polynomial representation u(x), including:
   a turbocoding operation, and
   an operation of transmitting, on a transmission channel, the sequence resulting from the turbocoding operation, and
   as a preliminary to said turbocoding operation, at least one precoding operation during which there are appended, to said sequence u(x), redundant symbols which guarantee the divisibility of the precoded sequence by at least one predetermined polynomial which is:
      a non-trivial multiple of the divisor polynomial used by the coder of said turbocoder, a coder which acts on the precoded sequence, and
      which is among the polynomials which have a high probability of dividing the polynomial representing a transmission error on said channel.

2. A coding method according to claim 1, including an operation of adding binary data items which guarantee the divisibility of the precoded sequence by a generator polynomial of a possibly abbreviated binary cyclic code.

3. A coding method according to either one of claims 1 or 2, wherein, during the turbocoding operation, use is made of at least one interleaver which maintains divisibility by the divisor polynomial used by the coder of the turbocoder which acts on the precoded sequence.

4. A coding method according to either one of claims 1 or 2, wherein, during the turbocoding operation, use is made of at least one interleaver defined by the polynomial relationship $a^*(x)=a(x^e)$ modulo $x^n+1$, e being a power of 2 and n being the formal degree of a(x).

5. A coding method according to either one of claims 1 or 2, wherein, during the precoding operation, there are appended, to said sequence u(x), redundant symbols which guarantee the divisibility of the precoded sequence by all the polynomials of weight at most equal to 4 and which are divisors of the product of the divisor polynomial of the turbodecoder and the polynomial of smallest degree N0 of the form $x^{N0}+1$, which is divisible by the divisor polynomial of the turbodecoder.

6. A coding method according to either one of claims 1 or 2, wherein, during the precoding operation, there are appended, to said sequence u(x), redundant symbols which guarantee the divisibility of the precoded sequence by predetermined polynomials which are multiples of the divisor polynomial of the turbocoder having a weight lower than a predetermined value, having a degree lower than another predetermined value and having a constant term which is non-null.

7. A coding method according to either one of claims 1 or 2, wherein, during the precoding operation, there are appended, to said sequence u(x), redundant symbols which guarantee the divisibility of the precoded sequence by polynomials for which it has been determined that they divide polynomials representing frequent errors on said channel, and for which the result of said division has a lower weight than the polynomial representing the error before division.

8. A device for coding a sequence of information symbols of polynomial representation u(x), having:
   a processing means adapted to turbocode, and
   a means of transmitting, on a transmission channel, the sequence resulting from the turbocoding,
   wherein the processing means is adapted, as a preliminary to the turbocoding, to precode said sequence u(x), adding redundant symbols thereto which guarantee the divisibility of the precoded sequence by at least one predetermined polynomial which is:
      a non-trivial multiple of the divisor polynomial used by the coder of said turbocoder, a coder which acts on the precoded sequence, and
      which is among the polynomials which have a high probability of dividing the polynomial representing a transmission error on said channel.

9. A coding device according to claim 8, wherein the processing means is also adapted to add binary data items which guarantee the divisibility of the precoded sequence by a generator polynomial of a possibly shortened binary cyclic code.

10. A coding device according to either one of claims 8 or 9, wherein the processing means is adapted, for turbocoding, to make use of at least one interleaver which maintains divisibility by the divisor polynomial used by the coder of the turbocoder which acts on the precoded sequence.

11. A coding device according to either one of claims 8 or 9, wherein the processing means is adapted, for turbocoding, to make use of at least one interleaver defined by the polynomial relationship $a^*(x)=a(x^e)$ modulo $x^n+1$, e being a power of 2 and n being the formal degree of a(x).

12. A coding device according to either one of claims 8 or 9, wherein the processing means is adapted, for precoding, to add, to said sequence u(x), redundant symbols which guarantee the divisibility of the precoded sequence by all the polynomials of weight at most equal to 4 and which are divisors of the product of the divisor polynomial of the turbodecoder and the polynomial of smallest degree N0 of the form $x^{N0}+1$, which is divisible by the divisor polynomial of the turbodecoder.

13. A coding device according to either one of claims 8 or 9, wherein the processing means is adapted, for precoding, to append, to said sequence u(x), redundant symbols which guarantee the divisibility of the precoded sequence by predetermined polynomials which are multiples of the divisor polynomial of the turbocoder having a weight lower than a predetermined value, having a degree lower than another predetermined value and having a constant term which is non-null.

14. A coding device according to either one of claims 8 or 9, wherein the processing means is adapted, for precoding, to append, to said sequence u(x), redundant symbols which guarantee the divisibility of the precoded sequence by polynomials of which it has been determined that they divide polynomials representing frequent errors on said channel, and for which the result of said division has a lower weight than the polynomial representing the error before division.

15. A data transmission device having a transmitter adapted to use a packet transmission protocol, which has a coding device according to either one of claims 8 or 9.

16. A data transmission device having a transmitter adapted to use the ATM ("Asynchronous Transfer Mode") packet transmission protocol, which has a coding device according to either one of claims 8 or 9.

17. A data transmission device having a transmitter adapted to use a packet transmission protocol, on an ETHERNET (registered trade mark) type network, which has a coding device according to either one of claims 8 or 9.

18. A device for transmitting data of any type including notably speech, image or multimedia type data, having a transmitter of signals transmitted on a wireless channel, which has a coding device according to either one of claims 8 or 9.

19. A decoding method, which takes into account: predetermined polynomials $p_i$, i=0, . . . , v, divisors of a polynomial p, and a polynomial q, which can be used as a generator of a shortened error correcting binary cyclic code, an operation of coding a polynomial u, representing a physical quantity, into a polynomial v1, which is a multiple of γ=p.q, and an operation of turbocoding of v1 into v=[v1, v2, v3], using a feedback polynomial g and an interleaver maintaining divisibility by g, said decoding method comprising:

an operation of reception of v in the form of a triplet r=[r1, r2, r3];

an operation of turbodecoding of r producing an estimate d of v1;

an operation of division of said estimate â by each of said predetermined polynomials $p_i$; and an operation of verification that, for all i, the residue of a modulo $p_i$ is null, wherein, if said residue of â modulo $p_i$ is null, then the polynomial $b_i$=â/$p_i$ is decoded into a word $bi^c$ of the shortened cyclic code of generator polynomial q.

20. A decoding method according to claim 19, wherein, during said division operations, the remainders are calculated of the divisions of the turbodecoded sequence by all polynomials of weight at most equal to 4 and which are divisors of the product of the divisor polynomial of the turbodecoder and the polynomial of smallest degree N0 of the form $x^{N0}$+1, which is divisible by the divisor polynomial of the turbodecoder.

21. A decoding method according to claim 19, wherein, during said division operations, the remainders are calculated of the divisions of the turbodecoded sequence by polynomials which are multiples of the divisor polynomial of the turbocoder and having a weight lower than a predetermined value, and whose degree is lower than another predetermined value, and having a constant term which is non-null.

22. A decoding method according to claim 19, wherein, during said division operations, remainders are calculated of the divisions of the turbocoded sequence by polynomials for which it has been determined that they divide polynomials representing frequent errors, and for which the result of said division has a lower weight than the polynomial representing the error before division.

23. A decoding method according to claim 19, wherein each sequence $\hat{a}_i$=$p_i b_i^c$ is turbocoded into a triplet $t_i$=[$\hat{a}_i$, $a_i.h_1/g$, $\hat{a}_i.h_2/g$], where g, $h_1$, and $h_2$ are the polynomials specifying the turbocode (g being said feedback polynomial).

24. A decoding method according to claim 23, wherein the decoded version of a sequence a representing the polynomial u is the sequence $\hat{a}_i$ for which the Hamming distance between r and $t_i$ is the smallest.

25. A decoding method according to claim 19, wherein one of said polynomials $p_i$ is said feedback polynomial g.

26. A decoding method according to claim 25, including an error detection operation during which, if said residue of â modulo $p_i$ is not null, an error is detected.

27. A decoding method according to claim 19, including, if said residue of â modulo $p_i$ is null, an operation of removing binary data items from a final estimated sequence obtained from the estimate â.

28. A decoding method according to claim 27, wherein, during said removal operation, a number of binary data items equal to the sum of the degree of the generator polynomial q of the shortened binary cyclic code and the degree of the smallest common multiple of said predetermined polynomials $p_i$ is taken away.

29. A decoding method according to claim 28, wherein, during the turbodecoding operation, use is made of at least one interleaver which maintains divisibility by said predetermined polynomials.

30. A decoding method according to claim 29, wherein, during the turbodecoding operation, use is made of at least one interleaver defined by the polynomial relationship $a^*(x)=a(x^e)$ modulo $x^n+1$, e being a power of 2 and n the formal degree of a(x).

31. A decoding method according to claim 19, including an operation of correcting errors in a sequence resulting from said division operation.

32. A decoding method according to claim 31, including an operation of multiplying each sequence resulting from said error correcting operation by one of said predetermined polynomials.

33. A decoding method according to claim 32, including an operation of correcting errors in a sequence resulting from said turbodecoding operation.

34. A decoding method according to claim 33, including an operation of turbocoding at least one sequence resulting from a multiplication operation and the sequence resulting from said operation of correcting errors in a sequence resulting from said turbodecoding operation, said turbocoding operation using the turbocode corresponding to the turbodecoder.

35. A decoding method according to claim 32, including an operation of comparing each sequence resulting from the turbocoding operation with the received sequence, and selecting the sequence resulting from the turbocoding operation which is closest to the received sequence.

36. A decoding device, having a processing means adapted to take into account:

predetermined polynomials $p_i$, i=0, . . . , v, divisors of a polynomial p, a polynomial q, which can be used as a generator of a shortened error correcting binary cyclic code, an operation of coding a polynomial u, representing a physical quantity, into a polynomial v1, which is a multiple of γ=p.q, and an operation of turbocoding of v1 into v=[v1, v2, v3], using a feedback polynomial g and an interleaver maintaining divisibility by g, said decoding method including:

an operation of reception of v in the form of a triplet r=[r1, r2, r3];

an operation of turbodecoding of r producing an estimate â of v1;

an operation of division of said estimate â by each of said predetermined polynomials $p_i$; and an operation of verification that, for all i, the residue of â modulo $p_i$ is null, wherein, if said residue of â modulo $p_i$ is null, then the polynomial $b_i$=â/$p_i$ is decoded into a word $bi^c$ of the shortened cyclic code of generator polynomial q.

37. A device for receiving transmitted data having a receiver adapted to use a packet transmission protocol, which has a decoding device according to claim 36.

38. A device for receiving transmitted data having a receiver adapted to use the ATM ("Asynchronous Transfer Mode") packet transmission protocol, which has a decoding device according to claim 36.

39. A device for receiving transmitted data having a receiver adapted to use a packet transmission protocol, on an ETHERNET (registered trade mark) type network, which has a decoding device according to claim 36.

40. A device for receiving transmitted data having a receiver for signals transmitted on a wireless channel, which has a decoding device according to claim 36.

41. A network station, which has a device according to claim 36.

42. A decoding device according to claim 36, wherein the processing means is adapted to divide the turbodecoded sequence by all the polynomials of weight at most equal to 4 and which are divisors of the product of the divisor polynomial of the turbodecoder and the polynomial of smallest degree N0 of the form $x^{N0}$+1 which is divisible by the divisor polynomial of the turbodecoder.

43. A decoding device according to claim 36, wherein the processing means is adapted to divide the turbodecoded sequence by polynomials which are multiples of the divisor polynomial of the turbocoder having a weight lower than a predetermined value, and whose degree is lower than another predetermined value, and having a constant term which is non-null.

44. A decoding device according to claim 36, wherein the processing means is adapted to divide the turbocoded sequence by polynomials of which it has been determined that they divide polynomials representing frequent errors, and for which the result of said division has a lower weight than the polynomial representing the error before division.

45. A decoding device according to claim 36, wherein one of said polynomials $p_i$ is said feedback polynomial g.

46. A decoding device according to claim 45, including an error detection means adapted, if said residue of â modulo $p_i$ is not null, to conclude that an error is detected.

47. A decoding device according to claim 36, wherein each sequence $ã_i$=$p_i b_i^c$ is turbocoded into a triplet $t_i$=[$ã_i$, $a_i.h_1/g$, $ã_i.h_2/g$], where g, $h_1$, and $h_2$ are the polynomials specifying the turbocode (g being said feedback polynomial).

48. A decoding device according to claim 47, wherein the decoded version of a sequence a representing the polynomial u is the sequence $ã_i$ for which the Hamming distance between r and $t_i$ is the smallest.

49. A decoding device according to claim 47, wherein the processing means is adapted, if said residue of â modulo $p_i$ is not null, to remove binary data items from a final estimated sequence obtained from said estimate â.

50. A decoding device according to claim 36, wherein the processing means is adapted to take away a number of binary data items equal to the sum of the degree of the generator polynomial of the possibly shortened binary cyclic code and the degree of the smallest common multiple of said predetermined polynomials $p_i$.

51. A decoding device according to claim 50, wherein the processing means is adapted, for turbodecoding, to make use of at least one interleaver which maintains divisibility by said predetermined polynomials.

52. A decoding device according to claim 51, wherein the processing means is adapted, for turbodecoding, to make use of at least one interleaver defined by the polynomial relationship a*(x)=a($x^e$) modulo $x^n$+1, e being a power of 2 and n the formal degree of a(x).

53. A decoding device according to claim 52, wherein the processing means is adapted to perform error correction in a sequence resulting from said division.

54. A decoding device according to claim 53, wherein the processing means is adapted to multiply each sequence resulting from an error correction by one of said predetermined polynomials.

55. A decoding device according to claim 54, wherein the processing means is adapted to correct the turbodecoded sequence.

56. A decoding device according to claim 55, wherein the processing means is adapted to turbocode at least one sequence resulting from a multiplication and the corrected sequence of the sequence resulting from said turbodecoding operation, said turbocoding using the turbocode corresponding to the turbodecoder.

57. A decoding device according to claim 56, wherein the processing means is adapted to compare each sequence resulting from the turbocoding with the received sequence and to select the sequence resulting from the turbocoding which is closest to the received sequence.

* * * * *

UNITED STATES PATENT AND TRADEMARK OFFICE
CERTIFICATE OF CORRECTION

PATENT NO. : 6,578,170 B1
DATED : June 10, 2003
INVENTOR(S) : Philippe Piret et al.

It is certified that error appears in the above-identified patent and that said Letters Patent is hereby corrected as shown below:

Column 2,
Line 2, "preceding" should read -- precoding --.

Column 6,
Line 28, "preceding" should read -- precoding --.

Column 12,
Line 62, "leaves"." should read -- leaver." --.

Column 13,
Line 61, "$1+x+X^4$." should read -- $1+x+x^4$. --.

Column 14,
Line 3, ""interleaves"" should read -- "interleaver." --.

Column 21,
Line 43, "d of v1;" should read -- â of v1; --.

Column 22,
Line 57, "claim 32," should read -- claim 34, --.

Signed and Sealed this

Fourth Day of October, 2005

JON W. DUDAS
*Director of the United States Patent and Trademark Office*